United States Patent
Uemura et al.

(10) Patent No.: US 12,298,332 B2
(45) Date of Patent: May 13, 2025

(54) OUTPUT CIRCUIT WITH PEAK VOLTAGE DETECTION

(71) Applicant: Sumitomo Electric Industries, Ltd., Osaka (JP)

(72) Inventors: Hiroshi Uemura, Osaka (JP); Keiji Tanaka, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 94 days.

(21) Appl. No.: 18/108,748

(22) Filed: Feb. 13, 2023

(65) Prior Publication Data

US 2023/0258698 A1 Aug. 17, 2023

(30) Foreign Application Priority Data

Feb. 17, 2022 (JP) .................. 2022-023017

(51) Int. Cl.
*G01R 19/30* (2006.01)
*G01R 15/06* (2006.01)

(52) U.S. Cl.
CPC ............. *G01R 19/30* (2013.01); *G01R 15/06* (2013.01)

(58) Field of Classification Search
CPC ........ G01R 19/30; G01R 15/06; G01R 19/04; H03K 5/1532
USPC ......... 324/500, 600, 679, 534, 76.11, 763.01
See application file for complete search history.

(56) References Cited

U.S. PATENT DOCUMENTS

| 8,164,159 B1 * | 4/2012 | Armstrong ........... H03B 5/1234 |
| | | 257/659 |
| 11,916,494 B2 * | 2/2024 | Lyasu .................... H02M 3/158 |
| 2009/0196072 A1 * | 8/2009 | Ye ......................... H02M 7/493 |
| | | 363/17 |
| 2011/0148375 A1 * | 6/2011 | Tsuji ..................... H03F 1/0211 |
| | | 330/297 |
| 2012/0274295 A1 * | 11/2012 | Lin ..................... H02M 3/1582 |
| | | 323/282 |
| 2017/0063225 A1 * | 3/2017 | Guo ....................... H02M 3/158 |

FOREIGN PATENT DOCUMENTS

| JP | 2012-531119 A | 12/2012 |
| WO | 2010/148369 A1 | 12/2010 |

* cited by examiner

*Primary Examiner* — Huy Q Phan
*Assistant Examiner* — Trung Q Nguyen
(74) *Attorney, Agent, or Firm* — Volpe Koenig

(57) ABSTRACT

An output circuit includes: an inductor, an amplifier circuit that outputs an output signal via the inductor, an output terminal that outputs the output signal to an outside, a voltage divider circuit including a series circuit constituted by a first capacitive element and a second capacitive element connected in series to the first capacitive element, the series circuit generating a first voltage-divided signal by dividing a voltage of the output signal, a first band-adjusting element having a resistance component for generating a first band-adjusted signal by adjusting frequency characteristics of the first voltage-divided signal, and a first peak detection circuit that detects a peak voltage of the first band-adjusted signal and output a first peak voltage in accordance with the detected peak voltage.

14 Claims, 9 Drawing Sheets

OUTPUT CIRCUIT WITH PEAK VOLTAGE DETECTION

CROSS-REFERENCE TO RELATED APPLICATION

This application claims priority from Japanese Patent Application No. 2022-023017, filed on Feb. 17, 2022, the entire subject matter of which is incorporated herein by reference.

TECHNICAL FIELD

The present disclosure relates to an output circuit with peak voltage detection.

BACKGROUND

A peak detection circuit for detecting a peak voltage of an output signal is known. For example, Japanese Unexamined Patent Application Publication (Translation of PCT Application) No. 2012-531119 discloses a configuration in which an output signal is divided by capacitors connected in series and a peak voltage of the divided signal is detected.

SUMMARY

According to one aspect of the present disclosure, there is provided an output circuit including: an inductor, an amplifier circuit that outputs an output signal via the inductor, an output terminal that outputs the output signal to an outside, a voltage divider circuit including a series circuit constituted by a first capacitive element and a second capacitive element connected in series to the first capacitive element, the series circuit generating a first voltage-divided signal by dividing a voltage of the output signal, a first band-adjusting element having a resistance component for generating a first band-adjusted signal by adjusting frequency characteristics of the first voltage-divided signal, and a first peak detection circuit that detects a peak voltage of the first band-adjusted signal and output a first peak voltage in accordance with the detected peak voltage.

DETAILED DESCRIPTION

Specific examples of an output circuit according to embodiments of the present disclosure will be described below with reference to the drawings. The present disclosure is not limited to these examples, but is defined by the scope of the claims, and is intended to include all modifications within the meaning and scope equivalent to the scope of the claims.

Figure 1:
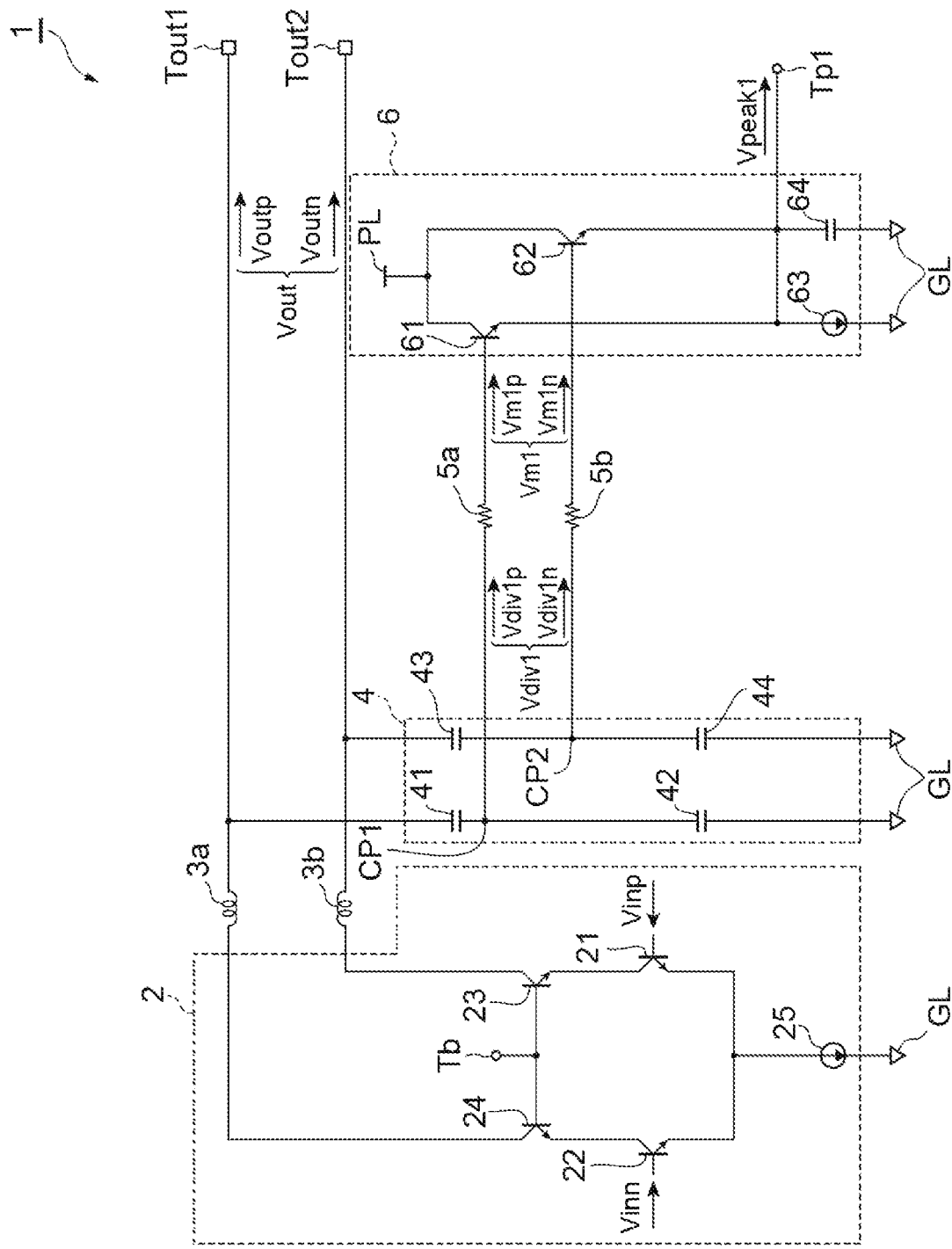
FIG. 1 illustrates a circuit configuration of an output circuit according to one embodiment.

FIG. 1 illustrates a circuit configuration of an output circuit according to an embodiment. An output circuit 1 shown in FIG. 1 is a circuit for outputting an output signal Vout to an outside. The output circuit 1 is, for example, a driver circuit that drives an optical modulator. The output circuit 1 is configured as an integrated circuit (IC), for example. The output circuit 1 is configured as a final stage in, for example, a driver IC for an optical modulator, and outputs the output signal Vout as a driving signal of the optical modulator. In the embodiment of the present disclosure, the output signal Vout is a differential signal and includes a normal phase component Voutp and a reverse phase component Voutn. Here, the normal phase component Voutp and the reverse phase component Voutn are voltage signals independent of each other. In general, the normal phase component and the reverse phase component of the differential signal are complementary signals whose phases are different from each other by 180°. For example, when the voltage of the normal phase component increases, the voltage of the reverse phase component decreases, and when the voltage of the normal phase component decreases, the voltage of the reverse phase component increases. When the voltage of the normal phase component reaches the peak value (maximum value), the voltage of the reverse phase component reaches the bottom value (minimum value), and when the voltage of the normal phase component reaches the bottom value, the voltage of the reverse phase component reaches the peak value. The normal phase component and the reverse phase component may have the same amplitude and the same center value (average value) with respect to voltage.

The output circuit 1 includes an output terminal Tout1 and an output terminal Tout2 for outputting the output signal Vout to the outside of the output circuit 1. The output terminal Tout1 is a terminal that outputs, for example, the normal phase component Voutp to the outside of the output circuit 1. The output terminal Tout2 is a terminal that outputs, for example, the reverse phase component Voutn to the outside of the output circuit 1. When the output circuit 1 is configured as the final stage of the driver IC, the output terminal Tout1 and the output terminal Tout2 may be formed as bonding pads on the IC chip, for example. The output circuit 1 is connected to a grounding wire GL. The grounding wire GL is a wiring for supplying a ground potential to the output circuit 1.

The output circuit 1 includes an amplifier circuit 2, inductors 3a and 3b, a voltage divider circuit 4, band-adjusting elements 5a and 5b (first band-adjusting elements), and a peak detection circuit 6 (first peak detection circuit).

The amplifier circuit 2 is a circuit that amplifies a differential input signal to generate a differential current signal (differential output signal). The differential input signal includes a normal phase component Vinp and a reverse phase component Vinn. Here, the normal phase component Vinp and the reverse phase component Vinn are voltage signals independent of each other. The amplifier circuit 2 includes, for example, transistors 21, 22, 23, and 24, and a current source 25. The transistors 21, 22, 23, and 24 are, for example, NPN-type bipolar transistors. The amplifier circuit 2 constitutes, for example, an open collector type amplifier circuit.

The normal phase component Vinp is input to a base of the transistor 21. The reverse phase component Vinn is input to a base of the transistor 22. An emitter of the transistor 21 and an emitter of the transistor 22 are electrically connected to each other and further electrically connected to the current source 25. A collector of the transistor 21 is electrically connected to an emitter of the transistor 23. A collector of the transistor 22 is electrically connected to an emitter of the transistor 24. The transistor 21 modulates a collector current by the normal phase component Vinp. This collector current flows from the emitter of the transistor 23 into the collector of the transistor 21. The transistor 22 modulates a collector current by the reverse phase component Vinn. This collector current flows from the emitter of the transistor 24 into the collector of the transistor 22. Electrical characteristics of the transistor 21 may be substantially the same as electrical characteristics of the transistor 22. For example, a transistor structure of the transistor 21 may be the same as a transistor structure of the transistor 22. Here, "substantially the same" means that, for example, when the transistor 22 and the transistor 21 are designed as transistors to have the same electrical characteristics, the electrical characteristics may be different from each other within a range of manufacturing variation.

The transistors 23 and 24 may be referred to as cascode transistors. A base of the transistor 23 and a base of the transistor 24 are electrically connected to each other and further electrically connected to a bias supply terminal Tb. A predetermined bias voltage is supplied to the bias supply terminal Tb. That is, a bias voltage is applied to the bases of the transistors 23 and 24. A collector of the transistor 23 is electrically connected to the output terminal Tout2 via an inductor 3b. A collector of the transistor 24 is electrically connected to the output terminal Tout1 via an inductor 3a. The potential of each emitter of the transistors 23 and 24 is kept at a constant value corresponding to the bias voltage. When a reference potential is the ground potential, the voltage of each emitter of the transistors 23 and 24 is kept at a static voltage based on the ground potential. The transistor 23 suppresses a voltage fluctuation at the collector of the transistor 21 during an amplifying operation, and reduces a Miller capacitance of the transistor 21. Similarly, the transistor 24 suppresses a voltage fluctuation at the collector of the transistor 22 during an amplifying operation, and reduces a Miller capacitance of the transistor 22. The reduction of the Miller capacitance contributes to the improvement of the frequency characteristics of the gain of the amplifier circuit 2. Electrical characteristics of the transistor 23 may be substantially the same as electrical characteristics of the transistor 24. A collector current of the transistor 24 and a collector current of the transistor 23 constitute the differential output signal. The collector current of the transistor 24 flows from an external load circuit (terminator circuit) connected to the terminal Tout1 into the collector of the transistor 24 via the inductor 3a. The collector current of the transistor 23 flows from an external load circuit (terminator circuit) connected to the terminal Tout2 into the collector of the transistor 23 via the inductor 3b. For example, the collector current of the transistor 24 becomes the normal phase component of the differential output signal, and the collector current of the transistor 23 becomes the reverse phase component of the differential output signal. Note that the normal phase component and the reverse phase component are a pair of complementary signals and indicate that they are in a relative relationship with each other. The normal phase component has a phase 180° different from a phase of the reverse phase component.

That is, as described above, the normal phase component and the reverse phase component have such a relationship that when the current of the normal phase component increases, the current of the reverse phase component decreases, and when the current of the normal phase component decreases, the current of the reverse phase component increases. For example, the normal phase component and the reverse phase component may be interchanged with each other and treated as a differential output signal. Note that the logic of the differential output signal is inverted by interchanging the normal phase component and the reverse phase component.

The current source 25 supplies an emitter current of the transistor 21 and an emitter current of the transistor 22. One end of the current source 25 is electrically connected to the emitter of the transistor 21 and the emitter of the transistor 22. The other end of the current source 25 is electrically connected to the grounding wire GL. The current source 25 supplies a constant current. Therefore, when the emitter current of the transistor 21 increases, the emitter current of the transistor 22 decreases, and when the emitter current of the transistor 21 decreases, the emitter current of the transistor 22 increases. The sum of the emitter currents of the transistor 21 and the transistor 22 is equal to the constant current supplied by the current source 25. More specifically, when the voltage of the normal phase component Vinp input to the base of the transistor 21 is higher than the voltage of the reverse phase component Vinn input to the base of the transistor 22, the emitter current of the transistor 21 becomes larger than the emitter current of the transistor 22. Further, when the voltage of the normal phase component Vinp input to the base of the transistor 21 is lower than the voltage of the reverse phase component Vinn input to the base of the transistor 22, the emitter current of the transistor 21 becomes smaller than the emitter current of the transistor 22. When each of the transistor 21 and the transistor 22 has a current amplification factor as large as several tens or more, the collector current can be considered to be substantially equal to the emitter current while ignoring the base current. In addition, it can be considered that the collector current of each of the transistor 23 and the transistor 24 is substantially equal to the emitter current, ignoring the base current. Accordingly, the differential current signal (differential output signal) is generated in accordance with a voltage difference between the normal phase component and the reverse phase component of the differential input signal. Thus, the amplifier circuit 2 is a differential amplifier circuit that generates a differential output signal in accordance with a differential input signal.

The inductors 3a and 3b are circuit elements for generating the output signal Vout in accordance with the differential output signal output from the amplifier circuit 2. Specifically, the inductor 3a is configured to generate the normal phase component Voutp in accordance with the normal phase component of the differential output signal described above, and the inductor 3b is configured to generate the reverse phase component Voutn in accordance with the reverse phase component of the differential output signal described above.

The inductor 3a is electrically connected between the collector of the transistor 24 and the output terminal Tout1. Specifically, one end of the inductor 3a is electrically connected to the collector of the transistor 24, and the other end of the inductor 3a is electrically connected to the output terminal Tout1. The inductor 3b is electrically connected between the collector of the transistor 23 and the output terminal Tout2. Specifically, one end of the inductor 3b is electrically connected to the collector of the transistor 23, and the other end of the inductor 3b is electrically connected to the output terminal Tout2. The amplifier circuit 2 outputs the normal phase component Voutp through the inductor 3a and outputs the reverse phase component Voutn through the inductor 3b.

When the amplifier circuit 2 constitutes the open collector type amplifier circuit, the terminator circuit (not shown) is connected to each of the output terminal Tout1 and the output terminal Tout2 to generate the output signal Vout. More specifically, for example, when the optical modulator is connected to the terminator circuit including a termination resistor connected to a power supply wiring, the differential current signal flows through the pair of termination resistors to generate the output signal Vout. More specifically, when the voltage of the normal phase component Vinp is higher than the voltage of the reverse phase component Vinn, the emitter current of the transistor 24 (equivalent to the normal phase component of the differential current signal) is smaller than the emitter current of the transistor 23 (equivalent to the reverse phase component of the differential current signal). As each emitter current flows through a separate termination resistor, the voltage generated at the output terminal Tout1 (the normal phase component Voutp of the output signal Vout) is higher than the voltage generated at the output terminal Tout2 (the reverse phase component Voutn of the output signal Vout). When the voltage of the normal phase component Vinp is lower than the voltage of the reverse phase component Vinn, the emitter current of the transistor 24 (equivalent to the reverse phase component of the differential current signal) is larger than the emitter current of the transistor 23 (equivalent to the normal phase component of the differential current signal). As each emitter current flows through the separate termination resistor, the voltage generated at the output terminal Tout1 (the normal phase component Voutp of the output signal Vout) is lower than the voltage generated at the output terminal Tout2 (the reverse phase component Voutn of the output signal Vout). In this embodiment, the output signal Vout increases when the differential input signal increases, and the output signal Vout decreases when the differential input signal decreases, so that the output circuit 1 performs non-inverting amplification. For example, when the output circuit 1 performs non-inverting amplification, the output circuit 1 performs inverting amplification by interchanging the terminal Tout1 and the terminal Tout2 with each other. In the case where the amplifier circuit 2 constitutes the open collector type amplifier circuit, when the output terminal Tout1 and the output terminal Tout2 are open (unconnected), the differential current signal is not output, and the output signal Vout is undefined.

The voltage divider circuit 4 is a circuit that divides the output signal Vout to generate a voltage-divided signal Vdiv1 (first voltage-divided signal). The voltage-divided signal Vdiv1 includes a normal phase component Vdiv1p and a reverse phase component Vdiv1n. Specifically, the voltage divider circuit 4 divides the normal phase component Voutp and the reverse phase component Voutn respectively. The voltage divider circuit 4 includes, for example, capacitors 41, 42, 43, and 44.

The capacitor 41 (first capacitive element) and the capacitor 42 (second capacitive element) are connected in series with each other between the output terminal Tout1 and the grounding wire GL. Specifically, one end of the capacitor 41 is electrically connected to the output terminal Tout1. The other end of the capacitor 41 is electrically connected to one end of the capacitor 42. A connection point CP1 between the other end of the capacitor 41 and one end of the capacitor 42 is electrically connected to the peak detection circuit 6, which will be described later, via the band-adjusting element 5a. The other end of the capacitor 42 is electrically connected to the grounding wire GL.

High-frequency components of the normal phase component of the differential output signal output from the amplifier circuit 2 are amplified by the inductor 3a and the capacitors 41 and 42, whereby the normal phase component Voutp is generated. An inductance of the inductor 3a, a capacitance C1 of the capacitor 41, and a capacitance C2 of the capacitor 42 are determined according to an amplification amount of the high-frequency components of the normal phase component Voutp. Here, the high-frequency component refers to a signal component included in a specific frequency region having a relatively high frequency in the frequency characteristics of the normal phase component of the differential output signal. For example, the specific frequency region includes frequencies at which a strength of the signal begins to decrease as the frequency increases. For example, the inductor 3a and the capacitors 41 and 42 are set to perform peaking to broaden a bandwidth of the gain of the output circuit 1. The inductance of the inductor 3a is, for example, from 50 pH to 500 pH. The capacitance C1 is, for example, 10 fF to 100 fF. The capacitance C2 is, for example, 10 fF to 100 fF.

The voltage divider circuit 4 divides the normal phase component Voutp by the capacitor 41 and the capacitor 42 to generate the normal phase component Vdiv1p. The voltage divider circuit 4 outputs the normal phase component Vdiv1p from the connection point CP1. The voltage value of the normal phase component Vdiv1p is expressed by Equation (1) using the capacitance C1 and the capacitance C2. For convenience of description, the voltage value of the normal phase component Vdiv1p may be expressed as "Vdiv1p", and the voltage value of the normal phase component Voutp may be expressed as "Voutp" in Equation (1). Actually, the capacitances C1 and C2 are adjusted so as to obtain a desired voltage-divided ratio in consideration of an input capacitance of the peak detection circuit 6 and a parasitic capacitance of the band-adjusting element 5a.

[Equation 1]

$$Vdiv1p = \frac{C1}{C1 + C2} \times Voutp \qquad (1)$$

From Equation (1), the voltage-divided ratio of the voltage divider circuit 4 (the ratio of the normal phase component Vdiv1p to the normal phase component Voutp, namely Vdiv1p/Voutp) may be determined by the capacitances C1 and C2. For example, when the value of the capacitance C1 is equal to the value of the capacitance C2, the voltage-divided ratio becomes 1/2. When the value of the capacitance C1 is greater than the value of the capacitance C2, the voltage-divided ratio becomes greater than 1/2. When the value of he capacitance C1 is smaller than the value of the capacitance C2, the voltage-divided ratio becomes smaller than 1/2. However, in a frequency region lower than the cut-off frequency determined by the capacitances C1 and C2 and an impedance between the connection point CP1 and the ground potential, the voltage-divided ratio does not follow Equation (1). The capacitances C1 and C2 and the impedance between the connection point CP1 and the ground potential may be appropriately set such that the frequency range required for peak detection is higher than the cut-off frequency.

The capacitor 43 (first capacitive element) and the capacitor 44 (second capacitive element) are connected to each other in series between the output terminal Tout2 and the grounding wire GL. Specifically, one end of the capacitor 43 is electrically connected to the output terminal Tout2. The other end of the capacitor 43 is electrically connected to one end of the capacitor 44. A connection point CP2 between the other end of the capacitor 43 and the one end of the capacitor 44 is electrically connected to the peak detection circuit 6 described later via the band-adjusting element 5b. The other end of the capacitor 44 is electrically connected to the grounding wire GL.

The high-frequency components of the reverse phase component of the differential output signal output from the amplifier circuit 2 are amplified by the inductor 3b and the capacitors 43 and 44, whereby the reverse phase component Voutn is generated. An inductance of the inductor 3b, a capacitance C3 of the capacitor 43, and a capacitance C4 of the capacitor 44 are determined according to an amplification amount of the high-frequency components of the reverse phase component Voutn. Here, the high-frequency component refers to a signal component included in a specific frequency region having a relatively high frequency in the frequency characteristics of the reverse phase component of the differential output signal. For example, the specific frequency region includes frequencies at which the strength of the signal begins to decrease as the frequency increases. For example, the inductor 3b and the capacitors 43 and 44 are set to perform peaking (may be referred to as high-frequency peaking) so as to boost the gain around a frequency starting a roll off and broaden the bandwidth of the gain of the output circuit 1. The inductance of the inductor 3b is, for example, from 50 pH to 500 pH. The capacitance C3 is, for example, 10 fF to 100 fF. The capacitance C4 is, for example, 10 fF to 100 fF.

The voltage divider circuit 4 divides the reverse phase component Voutn by the capacitor 43 and the capacitor 44 to generate the reverse phase component Vdiv1n. The voltage divider circuit 4 outputs the reverse phase component Vdiv1n from the connection point CP2. The voltage value of the reverse phase component Vdiv1n is expressed by Equation (2) using the capacitance C3 and the capacitance C4. For convenience of description, the voltage value of the reverse phase component Vdiv1n may be expressed as "Vdiv1n", and the voltage value of the reverse phase component Voutn may be expressed as "Voutn" in Equation (2). Actually, the capacitances C3 and C4 are adjusted so as to obtain a desired voltage-divided ratio in consideration of the input capacitance of the peak detection circuit 6 and a parasitic capacitance of the band-adjusting element 5b.

[Equation 2]

$$V_{div1n} = \frac{C3}{C3 + C4} \times V_{outn} \quad (2)$$

From Equation (2), the voltage-divided ratio of the voltage divider circuit 4 (the ratio of the reverse phase component Vdiv1n to the reverse phase component Voutn, namely Vdiv1n/Voutn) may be determined by the capacitances C3 and C4. For example, when the value of the capacitance C3 is equal to the value of the capacitance C4, the voltage-divided ratio becomes 1/2. When the value of the capacitance C3 is greater than the value of the capacitance C4, the voltage-divided ratio becomes greater than 1/2. When the value of the capacitance C3 is smaller than the value of the capacitance C4, the voltage-divided ratio becomes smaller than 1/2. However, in a frequency region lower than the cut-off frequency determined by the capacitances C3 and C4 and an impedance between the connection point CP2 and the ground potential, the voltage-divided ratio does not follow Equation (2). The capacitances C3 and C4 and the impedance between the connection point CP2 and the ground potential may be appropriately set such that the frequency range required for peak detection is higher than the cut-off frequency. Since the voltage divider circuit 4 divides the differential signal (output signal Vout) and outputs the divided differential signal (voltage-divided signal Vdiv1), the voltage-divided ratio of Equation (1) and the voltage-divided ratio of Equation (2) are set to the same value. Therefore, the capacitance C1 may be set to the same value as the capacitance C3, and the capacitance C2 may be set to the same value as the capacitance C4.

The band-adjusting elements 5a and 5b are circuit elements having resistance components and configured to adjust a band of the voltage-divided signal Vdiv1 to generate a detection signal Vm1 (first detection signal). The detection signal Vm1 includes a normal phase component Vm1p and a reverse phase component Vm1n. Specifically, the band-adjusting element 5a is used to adjust the band of the normal phase component Vdiv1p to generate the normal phase component Vm1p, and the band-adjusting element 5b is used to adjust the band of the reverse phase component Vdiv1n to generate the reverse phase component Vm1n. The band-adjusting elements 5a and 5b are, for example, resistance elements. The band is an example of the frequency characteristics in the present disclosure.

The band-adjusting element 5a is electrically connected between the connection point CP1 and the peak detection circuit 6. Specifically, one end of the band-adjusting element 5a is electrically connected to the connection point CP1, and the other end of the band-adjusting element 5a is electrically connected to a base of a transistor 61. The band-adjusting element 5b is electrically connected between the connection point CP2 and the peak detection circuit 6. Specifically, one end of the band-adjusting element 5b is electrically connected to the connection point CP2, and the other end of the band-adjusting element 5b is electrically connected to a base of a transistor 62. The resistance values of the band-adjusting elements 5a and 5b are, for example, 1 KΩ to 10 KΩ. The resistance value of the band-adjusting element 5b may be substantially the same as the resistance value of the band-adjusting element 5a.

Since a low-pass filter is formed by the band-adjusting element 5a and the input capacitance of the peak detection circuit 6, high-frequency components of the normal phase component Vdiv1p having frequencies higher than the cut-off frequency of the low-pass filter are reduced to generate the normal phase component Vm1p. Similarly, since a low-pass filter is formed by the band-adjusting element 5b and the input capacitance of the peak detection circuit 6, high-frequency components of the reverse phase component Vdiv1n having frequencies higher than the cut-off frequency of the low-pass filter are reduced to generate the reverse phase component Vm1n.

The cut-off frequencies of the low-pass filters are increased or decreased by adjusting the resistance values of the band-adjusting elements 5a and 5b, respectively. For example, when the resistance values of the band-adjusting elements 5a and 5b are increased, the cut-off frequencies are decreased, and when the resistance values of the band-adjusting elements 5a and 5b are decreased, the cut-off frequencies are increased. Accordingly, the band of the detection signal Vm1 is increased or decreased by adjusting the resistance values of the band-adjusting elements 5a and 5b. For example, when the band is narrowed by increasing the resistance values of the band-adjusting elements 5a and 5b, the high-frequency components due to the high-frequency peaking of the voltage-divided signal Vdiv1 are suppressed by the low-pass filters, and the spectrum of the detection signal Vm1 is flattened. When the band is widened by decreasing the resistance values of the band-adjusting elements 5a and 5b, the high-frequency peaked frequency components pass through the low-pass filters, and thus the spectrum of the detection signal Vm1 becomes similar to the spectrum of the voltage-divided signal Vdiv1 in which the high-frequency components are amplified by the high-frequency peaking.

The peak detection circuit 6 is a circuit that detects a peak voltage of the detection signal Vm1 and outputs a peak voltage Vpeak1 (first peak voltage) in accordance with the detected peak voltage. The peak voltage Vpeak1 is a voltage generated in accordance with the peak voltage of the detection signal Vm1. For example, the peak voltage Vpeak1 becomes smaller than the peak voltage of the detection signal Vm1 due to the base-emitter voltages of the transistors 61 and 62 to be described later. The peak detection circuit 6 outputs the peak voltage Vpeak1 from an output terminal Tp1 to the outside of the output circuit 1. Based on the peak voltage Vpeak1, the magnitude of the peak voltage of the input signal of the peak detection circuit 6 can be estimated. The estimated peak voltage corresponds to the peak voltage of the output signal Vout. This makes it possible to perform feedback control of the voltage gain of the output circuit 1 using, for example, an external control circuit. The output terminal Tp1 is a terminal that outputs the peak voltage Vpeak1 to the outside of the output circuit 1. The peak detection circuit 6 includes the transistors 61 and 62, a current source 63, and a capacitor 64. Incidentally, the peak voltage represents the maximum value (the maximum value of the voltage in the time domain) when the voltage of the electric signal changes with time. The peak voltage can be observed as the maximum value of the voltage waveform of the electric signal by an oscilloscope, for example. On the other hand, the electric signal is considered to have a spectrum indicating a voltage strength distribution in a frequency domain. For example, when the voltage strength in the relatively high frequency region is greater than the voltage strength in the low frequency region, the peak voltage is mainly determined by the voltage strength in the relatively high frequency region. When the voltage strength in the relatively high frequency region is smaller than the voltage strength in the low frequency region, the peak voltage is mainly determined by the voltage strength in the relatively low frequency region. For example, as a simple example easy to understand, a sinusoidal voltage signal having a frequency of 1 GHz would have a peak voltage corresponding to the voltage amplitude. When the voltage signal is passed through a low-pass filter of a cut-off frequency of 1 MHz, the amplitude of the voltage signal after passing through the low-pass filter is greatly attenuated because the frequency component of 1 GHz cannot pass through the low-pass filter, and accordingly the peak voltage becomes very small. Therefore, the peak voltage changes depending on the voltage spectrum of the frequency band of the electric signal.

The transistors 61 and 62 are, for example, NPN-type bipolar transistors. The base of the transistor 61 is electrically connected to the other end of the band-adjusting element 5a. The normal phase component Vm1p is input to the base of the transistor 61. The base of the transistor 62 is electrically connected to the other end of the band-adjusting element 5b. The reverse phase component Vm1n is input to the base of the transistor 62. A collector of the transistor 61 and a collector of the transistor 62 are electrically connected to each other, and are further electrically connected to a power supply wiring PL that supplies a power supply voltage. An emitter of the transistor 61 and an emitter of the transistor 62 are electrically connected to each other and are further electrically connected to the output terminal Tp1.

The current source 63 biases the transistors 61 and 62. That is, operation reference potentials of the transistors 61 and 62 are set by the current source 63. One end of the current source 63 is electrically connected to the output terminal Tp1, and the other end of the current source 63 is electrically connected to the grounding wire GL. The capacitor 64 is connected in parallel with the current source 63. That is, one end of the capacitor 64 is electrically connected to the output terminal Tp1, and the other end of the capacitor 64 is electrically connected to the grounding wire GL.

In the peak detection circuit 6, the capacitor 64 is charged according to the normal phase component Vm1p and the reverse phase component Vm1n which are input to the bases of the transistors 61 and 62, respectively. For example, when either one of the transistors 61 and 62 is in the ON state, a charging current flows into the capacitor 64, and electric charge is stored in the capacitor 64. For example, when the voltage value of the normal phase component Vm1p is larger than a sum of the peak voltage Vpeak1 and the base-emitter voltage of the transistor 61, the transistor 61 is turned on. Alternatively, when the voltage value of the reverse phase component Vm1n is larger than a sum of the peak voltage Vpeak1 and the base-emitter voltage of the transistor 62, the transistor 62 is turned on. When a sum of the peak voltage Vpeak1 and the base-emitter voltage is lower than the normal phase component Vm1p and the reverse phase component Vm1n, both the transistor 61 and the transistor 62 are turned on. On the other hand, when the transistors 61 and 62 are in OFF states, the electric charge stored in the capacitor 64 is released (discharged) by the current source 63. As a result of these charges and discharges, the peak voltage Vpeak1 is generated as a charging voltage of the capacitor 64. The electrical characteristics of the transistor 61 may be substantially the same as the electrical characteristics of the transistor 62. "Substantially the same" means that, for example, when the transistor 61 and the transistor 62 are designed as transistors having the same electrical characteristics, the electrical characteristics may be different from each other within a range of manufacturing variation.

In the output circuit 1 described above, the high-frequency components of the normal phase component Voutp are amplified by the inductor 3a and the capacitors 41 and 42. For example, by such amplification, the strength of the high-frequency components is increased over the strength of the low-frequency components. Here, the low-frequency component means a signal component included in a predetermined frequency range lower in frequency than a predetermined frequency range in which the high-frequency component is included. Increasing the strength of the high-frequency components to be higher than the strength of the low-frequency components is also referred to as high-frequency peaking. In the following description, a high-frequency component means a signal component of a frequency range whose signal strength is boosted by high-frequency peaking, and a low-frequency component means a signal component of a frequency range whose frequency is lower than the frequency range of the high-frequency peaking.

Since the high-frequency components of the normal phase component Voutp are amplified, the high-frequency components of the normal phase component Vdiv1p obtained by dividing the normal phase component Voutp are also larger than the low-frequency components. Since the low-pass filter is formed by the band-adjusting element 5a and the input capacitance of the peak detection circuit 6, the high-frequency components of the normal phase component Vdiv1p having frequencies higher than the cut-off frequency of the low-pass filter are reduced to generate the normal phase component Vm1p. For example, the strength of the high-frequency components of the normal phase component Vdiv1p can be attenuated by setting the cut-off frequency of the low-pass filter to be lower than a predetermined frequency range in which the high-frequency components are included.

Similarly, the high-frequency components of the reverse phase component Voutn are amplified (high-frequency peaked) by the inductor 3b and the capacitors 43 and 44. Therefore, the high-frequency components of the reverse phase component Vdiv1n obtained by dividing the voltage of the reverse phase component Voutn are larger than the low-frequency components of the reverse phase component Vdiv1n. Since the low-pass filter is formed by the band-adjusting element 5b and the input capacitance of the peak detection circuit 6, the high-frequency components of the reverse phase component Vdiv1n having frequencies higher than the cut-off frequency of the low-pass filter are reduced to generate the reverse phase component Vm1n. For example, the strength of the high-frequency components of the reverse phase component Vdiv1n can be attenuated by setting the cut-off frequency of the low-pass filter to be lower than a predetermined frequency range in which the high-frequency components are included.

Accordingly, the high-frequency components of the output signal Vout have signal strengths (amplitudes) greater than signal strengths (amplitudes) of the low-frequency components of the output signal Vout and the high-frequency components of the voltage-divided signal Vdiv1 have signal strengths (amplitudes) greater than signal strengths (amplitudes) of the low-frequency components of the voltage-divided signal Vdiv1, but the amplitudes of the high-frequency components of the detection signal Vm1 can be substantially equal to amplitudes of the low-frequency components of the detection signal Vm1, for example. Equalizing the signal strength in a wide band from a low frequency to a high frequency in this way is also referred to as flattening. The signal strength represents the magnitude of a signal component in a spectrum. The amplitude is an example of the signal strength. Therefore, it is possible to detect the peak voltage of the detection signal Vm1 flattened over a wide band from a low frequency to a high frequency and to output the peak voltage Vpeak1 according to the detection result.

In the output circuit 1, the capacitor 41 and the capacitor 42 are connected in series between the output terminal Tout1 and the grounding wire GL, and the capacitor 43 and the capacitor 44 are connected in series between the output terminal Tout2 and the grounding wire GL. The capacitors 41, 42, 43, and 44 are used for the high-frequency peaking. That is, the capacitors 41, 42, 43, and 44 used for the high-frequency peaking are used to form the voltage divider circuit 4. Therefore, since it is not necessary to provide a dedicated electronic component for the voltage divider circuit 4, the circuit scale of the output circuit 1 can be reduced.

Figure 2:
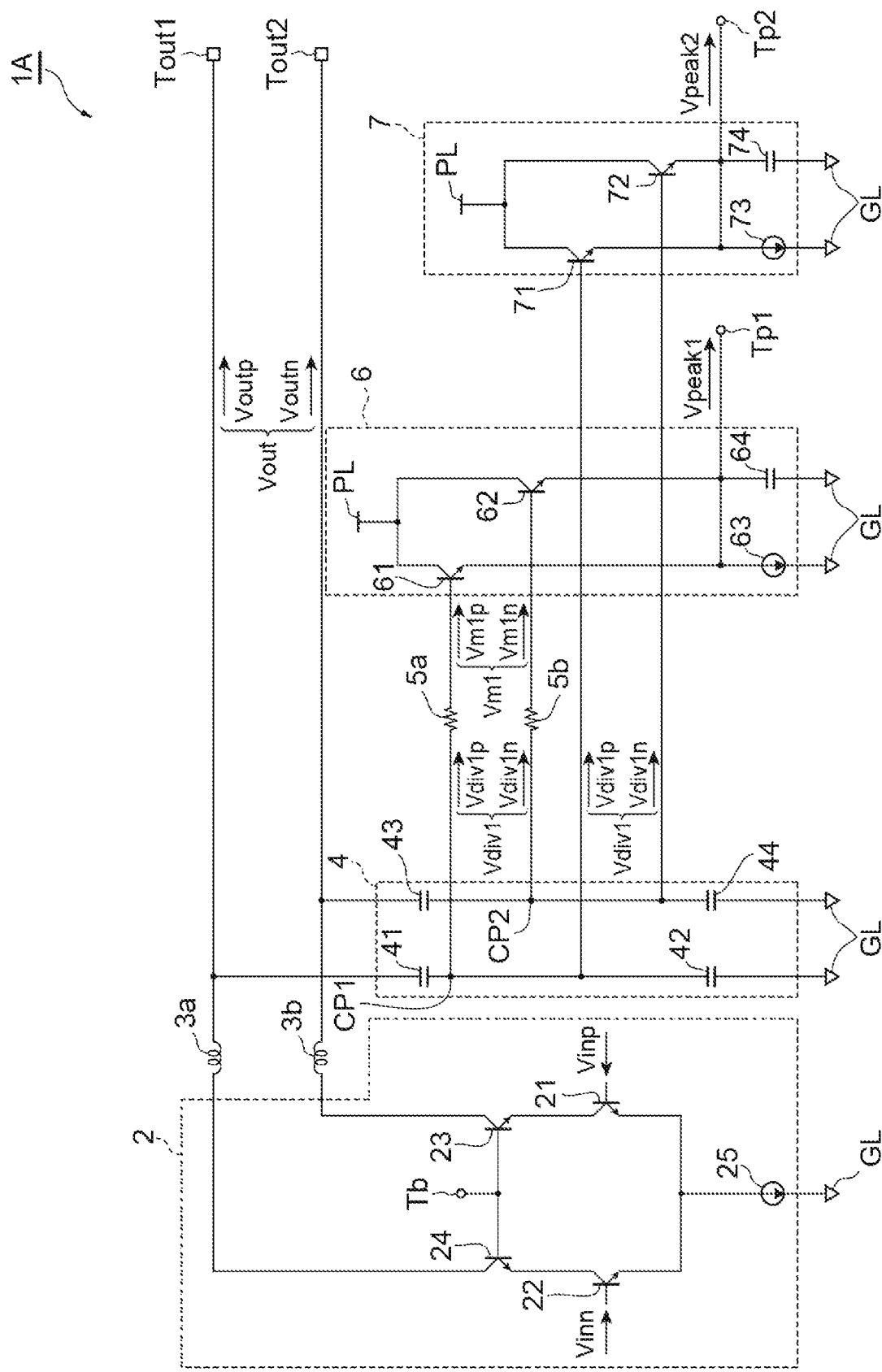
FIG. 2 illustrates a circuit configuration of an output circuit according to another embodiment.

Referring now to FIG. 2, an output circuit according to another embodiment will be described. FIG. 2 illustrates a circuit configuration of an output circuit according to another embodiment. An output circuit 1A shown in FIG. 2 is mainly different from the output circuit 1 in that the output circuit 1A further includes a peak detection circuit 7 (second peak detection circuit).

The peak detection circuit 7 is a circuit that detects a peak voltage of the voltage-divided signal Vdiv1 and outputs a peak voltage Vpeak2 (second peak voltage) in accordance with the detected peak voltage. The peak detection circuit 7 directly receives the voltage-divided signal Vdiv1 from the voltage divider circuit 4. In this embodiment, the peak voltage Vpeak2 is a voltage generated in accordance with the peak voltage of the voltage-divided signal Vdiv1. For example, the peak voltage Vpeak2 becomes smaller than the peak voltage of the voltage-divided signal Vdiv1 due to a base-emitter voltage of transistors 71 and 72, which will be described later. The peak detection circuit 7 outputs the peak voltage Vpeak2 from an output terminal Tp2 to the outside of the output circuit 1A. Based on the peak voltage Vpeak2, it is possible to estimate the magnitude of the peak voltage of the input signal of the peak detection circuit 7. The estimated peak voltage corresponds to the peak voltage of the output signal Vout. This makes it possible to perform feedback control of the voltage gain of the output circuit 1A using, for example, an external control circuit. The output terminal Tp2 is a terminal that outputs the peak voltage Vpeak2 to the outside of the output circuit 1A. The peak detection circuit 7 includes the transistors 71 and 72, a current source 73, and a capacitor 74.

The transistors 71 and 72 are, for example, NPN-type bipolar transistors. A base of the transistor 71 is electrically connected to the connection point CP1. The normal phase component Vdiv1p is input to the base of the transistor 71. A base of the transistor 72 is electrically connected to the connection point CP2. The reverse phase component Vdiv1n is input to the base of the transistor 72. A collector of the transistor 71 and a collector of the transistor 72 are electrically connected to each other and are further electrically connected to the power supply wiring PL. An emitter of the transistor 71 and an emitter of the transistor 72 are electrically connected to each other and are further electrically connected to the output terminal Tp2.

The current source 73 biases the transistors 71 and 72. That is, the operation reference potentials of the transistors 71 and 72 are set by the current source 73. One end of the current source 73 is electrically connected to the output terminal Tp2, and the other end of the current source 73 is electrically connected to the grounding wire GL. The capacitor 74 is connected in parallel with the current source 73. That is, one end of the capacitor 74 is electrically connected to the output terminal Tp2, and the other end of the capacitor 74 is electrically connected to the grounding wire GL.

In the peak detection circuit 7, the capacitor 74 is charged according to the normal phase component Vdiv1p and the reverse phase component Vdiv1n which are input to the bases of the transistors 71 and 72, respectively. For example, when either one of the transistors 71 and 72 is in the ON state, a charging current flows through the capacitor 74, and electric charge is stored in the capacitor 74. For example, when the voltage value of the normal phase component Vdiv1p is larger than a sum of the peak voltage Vpeak2 and the base-emitter voltage of the transistor 71, the transistor 71 is turned on. Alternatively, when the voltage value of the reverse phase component Vdiv1$n$ is larger than a sum of the peak voltage Vpeak2 and the base-emitter voltage of the transistor 72, the transistor 72 is turned on. When a sum of the peak voltage Vpeak2 and the base-emitter voltage is lower than the normal phase component Vm1$p$ and the reverse phase component Vm1$n$, both the transistor 71 and the transistor 72 are turned on. On the other hand, when the transistors 71 and 72 are in the Off states, the electric charge stored in the capacitor 74 is released (discharged) by the current source 73. As a result of these charges and discharges, the peak voltage Vpeak2 is generated as a charging voltage of the capacitor 74. The electrical characteristics of the transistor 71 may be substantially the same as the electrical characteristics of the transistor 72. "Substantially the same" means that, for example, when the transistor 71 and the transistor 72 are designed as transistors having the same electrical characteristics, the electrical characteristics may be different from each other within a range of manufacturing variation.

Also in the output circuit 1A, the same effects as those of the output circuit 1 can be obtained for the configuration common to the output circuit 1. Further, in the output circuit 1A, the peak detection circuit 7 detects the peak voltage of the voltage-divided signal Vdiv1 and outputs the peak voltage Vpeak2 in accordance with the detected peak voltage. The signal strengths (amplitudes) of the high-frequency components of the voltage-divided signal Vdiv1 are greater than the signal strengths (amplitudes) of the low-frequency components of the voltage-divided signal Vdiv1 due to, for example, high-frequency peaking. Therefore, in particular, it is possible to detect the peak voltage of the high-frequency components of the voltage-divided signal Vdiv1 and to output the peak voltage Vpeak2 in accordance with the detected peak voltage.

On the other hand, the peak voltage Vpeak1 is a voltage generated by detecting a peak voltage of the detection signal Vm1, where the detection signal Vm1 has signal components in a wide frequency range from a low frequency to a high frequency by reducing the high-frequency components of the voltage-divided signal Vdiv1 by the above-described low-pass filters. As a result, the magnitude of the high-frequency peaking amount of the voltage-divided signal Vdiv1 can be estimated by comparing the peak voltage Vpeak1 with the peak voltage Vpeak2. The estimated high-frequency peaking amount corresponds to the high-frequency peaking amount of the output signal Vout. Alternatively, for example, one of the peak voltage Vpeak1 and the peak voltage Vpeak2 can be selected and used in accordance with a spectrum (distribution of signal components in a frequency domain) of the output signal Vout. For example, when the optical modulator is driven by the output signal Vout, the peak voltage may be selected in consideration of response characteristics (frequency characteristics) of an optical signal with respect to a driving signal of the optical modulator.

The output circuit 1A can output the peak voltage Vpeak2 in addition to the peak voltage Vpeak1. By comparing the comparison result of these different peak voltages with the comparison result of the frequency characteristics in the input signals of the peak detection circuit 6 and the peak detection circuit 7, it is possible to estimate the contribution of the signal components in the specific frequency range to the peak voltage as described above. The specific frequency range is, for example, a frequency range of high-frequency peaking. Alternatively, for example, with respect to the signal strength (amplitude) spectrum of the output signal Vout, either one of the peak voltage Vpeak2 estimated by the detection signal (voltage-divided signal Vdiv1) and the peak voltage Vpeak1 estimated by the detection signal Vm1 can be selected and used. The detection signal (voltage-divided signal Vdiv1) has the same spectrum as the high-frequency peaked output signal Vout. The detection signal Vm1 has a spectrum flattened from a low frequency to a high frequency by eliminating the influence of the high-frequency peaking. For example, when the optical modulator is driven by the output signal Vout, the peak voltage may be selected in consideration of response characteristics (frequency characteristics) of an optical signal with respect to a driving signal of the optical modulator.

Figure 3:
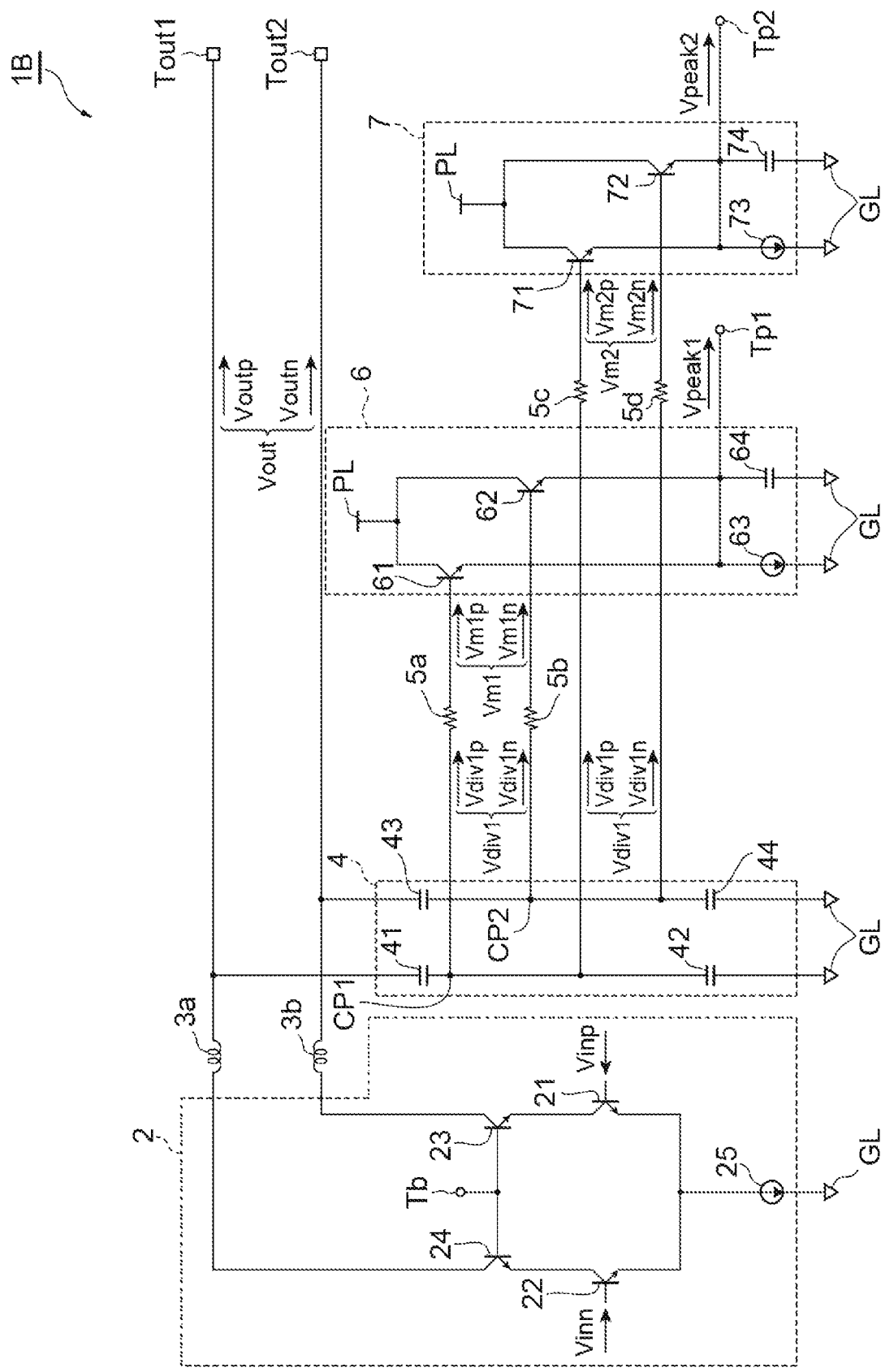
FIG. 3 illustrates a circuit configuration of an output circuit according to yet another embodiment.

Referring now to FIG. 3, an output circuit according to yet another embodiment will be described. FIG. 3 illustrates a circuit configuration of an output circuit according to yet another embodiment. An output circuit 1B shown in FIG. 3 is mainly different from the output circuit 1A in that the output circuit 1B further includes band-adjusting elements 5$c$ and 5$d$ (second band-adjusting element) and in the signal to be detected by the peak detection circuit 7.

The band-adjusting elements 5$c$ and 5$d$ are circuit elements having resistance components and configured to adjust the band of the voltage-divided signal Vdiv1 to generate a detection signal Vm2 (second detection signal). Specifically, the band-adjusting element 5$c$ is used to adjust the band of the normal phase component Vdiv1$p$ to generate a normal phase component Vm2$p$, and the band-adjusting element 5$d$ is used to adjust the band of the reverse phase component Vdiv1$n$ to generate a reverse phase component Vm2$n$. The band-adjusting elements 5$c$ and 5$d$ are, for example, resistance elements.

The band-adjusting element 5$c$ is electrically connected between the connection point CP1 and the peak detection circuit 7. Specifically, one end of the band-adjusting element 5$c$ is electrically connected to the connection point CP1, and the other end of the band-adjusting element 5$c$ is electrically connected to the base of the transistor 71. The band-adjusting element 5$d$ is electrically connected between the connection point CP2 and the peak detection circuit 7. Specifically, one end of the band-adjusting element 5$d$ is electrically connected to the connection point CP2, and the other end of the band-adjusting element 5$d$ is electrically connected to the base of the transistor 72. The resistance values of the band-adjusting elements 5$c$ and 5$d$ are different from the resistance values of the band-adjusting elements 5$a$ and 5$b$. The resistance values of the band-adjusting elements 5$c$ and 5$d$ are, for example, 5 KΩ to 50 KΩ. The resistance value of the band-adjusting element 5$c$ may be substantially the same as the resistance value of the band-adjusting element 5$d$.

Since a low-pass filter is formed by the band-adjusting element 5$c$ and the input capacitance of the peak detection circuit 7, high-frequency components of the normal phase component Vdiv1$p$ having frequencies higher than the cut-off frequency of the low-pass filter are reduced to generate the normal phase component Vm2$p$. Similarly, since a low-pass filter is formed by the band-adjusting element 5$d$ and the input capacitance of the peak detection circuit 7, high-frequency components of the reverse phase component Vdiv1$n$ having frequencies higher than the cut-off frequency of the low-pass filter are reduced to generate the reverse phase component Vm2$n$.

The cut-off frequencies of the low-pass filters are increased or decreased by adjusting the resistance values of the band-adjusting elements 5$c$ and 5$d$, respectively. For example, when the resistance values of the band-adjusting elements 5c and 5d are increased, the cut-off frequencies are decreased, and when the resistance values of the band-adjusting elements 5c and 5d are decreased, the cut-off frequencies are increased. Accordingly, the band of the detection signal Vm2 is increased or decreased by adjusting the resistance values of the band-adjusting elements 5c and 5d. For example, when the band is narrowed by increasing the resistance values of the band-adjusting elements 5c and 5d, the high-frequency components due to the high-frequency peaking of the voltage-divided signal Vdiv1 are suppressed by the low-pass filters, and the spectrum of the detection signal Vm2 is flattened. When the band is widened by decreasing the resistance values of the band-adjusting elements 5c and 5d, the high-frequency peaked frequency components pass through the low-pass filters, and thus the spectrum of the detection signal Vm2 becomes similar to the spectrum of the voltage-divided signal Vdiv1 in which the high-frequency components are amplified by the high-frequency peaking.

In this embodiment, the peak detection circuit 7 is a circuit that detects a peak voltage of the detection signal Vm2 and outputs the peak voltage Vpeak2 in accordance with the detected peak voltage. The peak voltage Vpeak2 is a voltage generated in accordance with the peak voltage of the detection signal Vm2. For example, the peak voltage Vpeak2 is smaller than the peak voltage of the detection signal Vm2 due to the base-emitter voltages of the transistors 71 and 72.

Also in the output circuit 1B, the same effects as those of the output circuit 1A can be obtained for the configuration common to the output circuit 1A. Further, in the output circuit 1B, the peak detection circuit 7 detects the peak voltage of the detection signal Vm2 and outputs the peak voltage Vpeak2 in accordance with the detected peak voltage. Since the low-pass filter is formed by the band-adjusting element 5c and the input capacitance of the peak detection circuit 7, high-frequency components of the normal phase component Vdiv1p higher than the cut-off frequency of the low-pass filter are reduced to generate the normal phase component Vm2p. Accordingly, for example, the reduction amount of the high-frequency components of the normal phase component Vdiv1p can be changed by adjusting the cut-off frequency of the low-pass filter by making the resistance value of the band-adjusting element 5a different from the resistance value of the band-adjusting element 5c.

Similarly, since the low-pass filter is formed by the band-adjusting element 5d and the input capacitance of the peak detection circuit 7, high-frequency components of the reverse phase component Vdiv1n higher than the cut-off frequency of the low-pass filter are reduced to generate the reverse phase component Vm2n. Accordingly, the reduction amount of the high-frequency components of the reverse phase component Vdiv1n can be changed by adjusting the cut-off frequency of the low-pass filter by making the resistance value of the band-adjusting element 5b different from the resistance value of the band-adjusting element 5d. Accordingly, for example, the signal strengths (amplitudes) of the high-frequency components of the detection signal Vm2 with respect to the output signal Vout subjected to high-frequency peaking can be set to be substantially the same as the signal strengths (amplitudes) of the low-frequency components. As a result, it is possible to detect the peak voltage of the detection signal Vm2 having a spectrum flattened in a wide band from a low frequency to a high frequency and output the peak voltage Vpeak2 in accordance with the detected peak voltage.

On the other hand, for example, the cut-off frequency of the low-pass filter formed by the band-adjusting element 5a and the input capacitance of the peak detection circuit 6 may be set higher than the cut-off frequency of the low-pass filter formed by the band-adjusting element 5c and the input capacitance of the peak detection circuit 7, and the cut-off frequency of the low-pass filter formed by the band-adjusting element 5b and the input capacitance of the peak detection circuit 6 may be set higher than the cut-off frequency of the low-pass filter formed by the band-adjusting element 5d and the input capacitance of the peak detection circuit 7. In this case, the spectrum of the detection signal Vm1 becomes an intermediate spectrum between the spectrum of the output signal Vout subjected to high-frequency peaking and the spectrum of the detection signal Vm2 flattened in a wide band from a low frequency to a high frequency. The peak voltage Vpeak1 becomes a voltage generated in accordance with the peak voltage of the detection signal Vm1 having such an intermediate spectrum. As a result, it is possible to estimate how much the high-frequency components of the detection signal Vm1 contribute to the peak voltage by comparing the peak voltage Vpeak1 with the peak voltage Vpeak2.

Alternatively, for example, with respect to the signal strength (amplitude) spectrum of the output signal Vout, either one the peak voltage Vpeak2 estimated by the detection signal Vm2 having a spectrum flattened from a low frequency to a high frequency by suppressing the influence of high-frequency peaking and the peak voltage Vpeak1 estimated by the detection signal (voltage-divided signal Vdiv1) having a spectrum in which the influence of high-frequency peaking is moderately suppressed compared to the detection signal Vm2 can be selected and used.

In the output circuit 1B, the band-adjusting elements 5c and 5d are provided between the voltage divider circuit 4 and the peak detection circuit 7. With this configuration, it is possible to reduce the influence of the input capacitance of the peak detection circuit 7 on the voltage-divided ratio of the voltage divider circuit 4.

Figure 4:
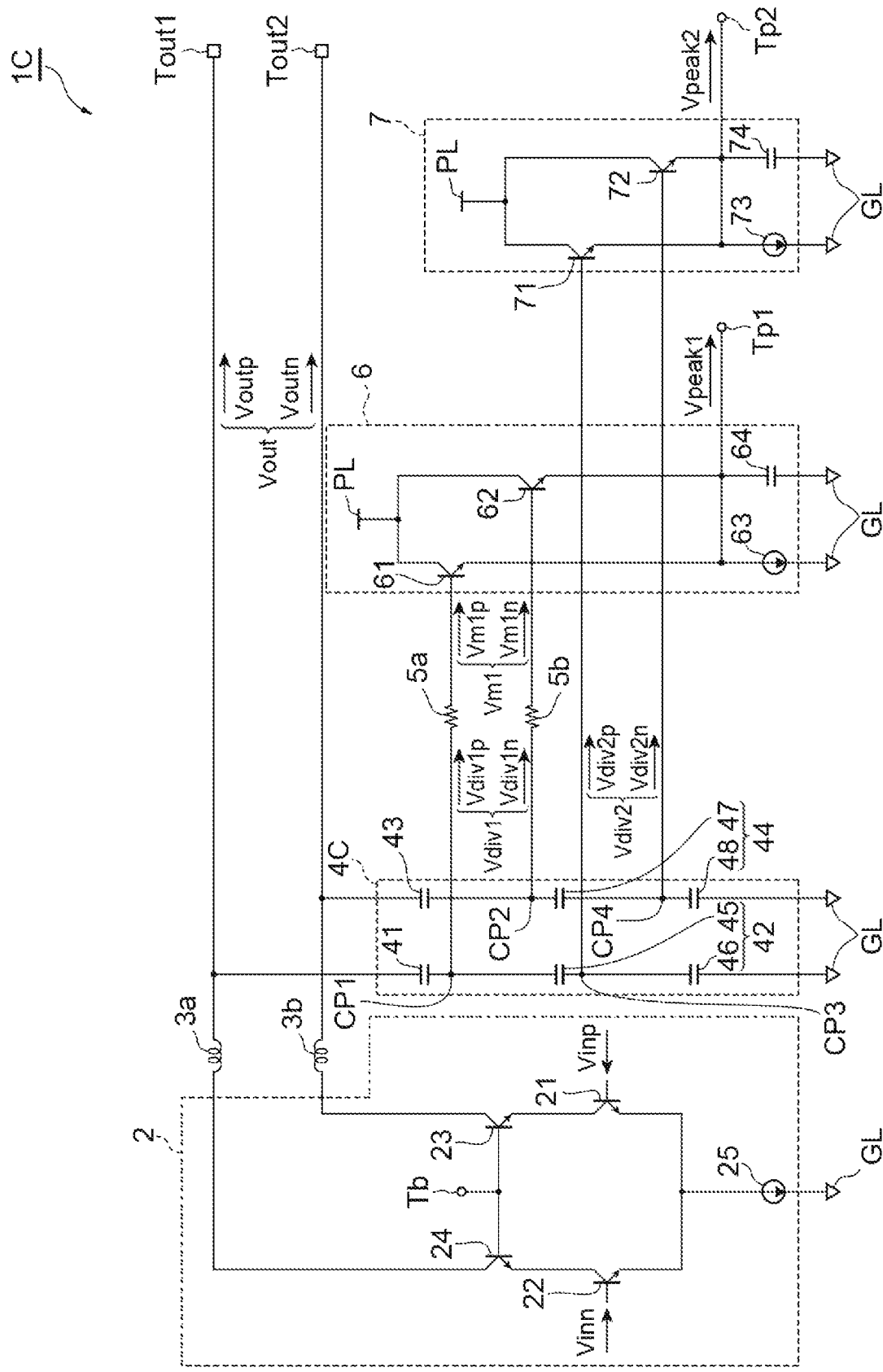
FIG. 4 illustrates a circuit configuration of an output circuit according to yet another embodiment.

Referring now to FIG. 4, an output circuit according to yet another embodiment will be described. FIG. 4 illustrates a circuit configuration of an output circuit according to yet another embodiment. An output circuit 1C shown in FIG. 4 is mainly different from the output circuit 1A in that the output circuit 1C includes a voltage divider circuit 4C in place of the voltage divider circuit 4 and in the signal to be detected by the peak detection circuit 7.

The voltage divider circuit 4C further generates a voltage-divided signal Vdiv2 (second voltage-divided signal) in addition to the voltage-divided signal Vdiv1 by dividing the output signal Vout. The voltage divider circuit 4C is mainly different from the voltage divider circuit 4 in that the capacitor 42 includes a capacitor 45 (third capacitive element) and a capacitor 46 (fourth capacitive element), and the capacitor 44 includes a capacitor 47 (third capacitive element) and a capacitor 48 (fourth capacitive element).

More specifically, the capacitor 42 is composed of the capacitors 45 and 46 connected in series with each other. One end of the capacitor 45 is electrically connected to the other end of the capacitor 41. The other end of the capacitor 45 is electrically connected to one end of the capacitor 46. A connection point CP3 between the other end of the capacitor 45 and one end of the capacitor 46 is electrically connected to the base of the transistor 71. The other end of the capacitor 46 is electrically connected to the grounding wire GL. That is, the capacitor 41, the capacitor 45, and the capacitor 46 are connected in series between the output terminal Tout1 and the grounding wire GL.

The capacitor 44 is composed of the capacitors 47 and 48 connected in series with each other. One end of the capacitor 47 is electrically connected to the other end of the capacitor 43. The other end of the capacitor 47 is electrically connected to one end of the capacitor 48. A connection point CP4 between the other end of the capacitor 47 and one end of the capacitor 48 is electrically connected to the base of the transistor 72. The other end of the capacitor 48 is electrically connected to the grounding wire GL. That is, the capacitor 43, the capacitor 47 and the capacitor 48 are connected in series between the output terminal Tout2 and the grounding wire GL.

The voltage divider circuit 4C divides the normal phase component Voutp by the capacitor 46 and the series circuit of the capacitor 41 and the capacitor 45 to generate a normal phase component Vdiv2p. The voltage divider circuit 4C outputs the normal phase component Vdiv2p from the connection point CP3. The voltage divider circuit 4C divides the reverse phase component Voutn by the capacitor 48 and the series circuit of the capacitor 43 and the capacitor 47 to generate a reverse phase component Vdiv2n. The voltage divider circuit 4C outputs the reverse phase component Vdiv2n from the connection point CP4.

At low frequencies, the voltage value (amplitude) of the voltage-divided signal Vdiv2 is smaller than the voltage value (amplitude) of the detection signal Vm1. On the other hand, the capacitance C1, the capacitance C3, a capacitance C5 of the capacitor 45, a capacitance C6 of the capacitor 46, a capacitance C7 of the capacitor 47, a capacitance C8 of the capacitor 48, the resistance value of the band-adjusting element 5a, and the resistance value of the band-adjusting element 5b may be set such that the voltage value (amplitude) of the voltage-divided signal Vdiv2 is substantially equal to the voltage value (amplitude) of the detection signal Vm1 at high frequencies. Here, the low frequency represents a frequency lower than the frequency range in which the signal component is amplified by the high-frequency peaking. Here, the high frequency represents a frequency within the frequency range of high-frequency peaking. As a result, for example, the amplitudes of the high-frequency components of the detection signal Vm1 can be made substantially equal to the amplitudes of the low-frequency components, the amplitudes of the low-frequency components of the voltage-divided signal Vdiv2 can be made smaller than the amplitudes of the low-frequency components of the detection signal Vm1, and the amplitudes of the high-frequency components of the voltage-divided signal Vdiv2 can be made substantially equal to the amplitudes of the high-frequency components of the detection signal Vm1.

In the embodiment, the peak detection circuit 7 detects a peak voltage of the voltage-divided signal Vdiv2 and outputs the peak voltage Vpeak2 in accordance with the detected peak voltage. The peak voltage Vpeak2 is a voltage generated in accordance with the peak voltage of the voltage-divided signal Vdiv2. The peak voltage Vpeak2 is smaller than the peak voltage of the voltage-divided signal Vdiv2 due to, for example, the base-emitter voltages of transistors 71 and 72.

Also in the output circuit 1C, the same effects as those of the output circuit 1A can be obtained for the configuration common to the output circuit 1A. Further, in the output circuit 1C, the voltage divider circuit 4C divides the normal phase component Voutp by the capacitor 46 and the capacitors 41 and 45 to generate the normal phase component Vdiv2p, and divides the reverse phase component Voutn by the capacitor 48 and the capacitors 43 and 47 to generate the reverse phase component Vdiv2n. The peak detection circuit 7 outputs the peak voltage Vpeak2 corresponding to the voltage-divided signal Vdiv2. Specifically, the peak detection circuit 7 detects the peak voltage of the voltage-divided signal Vdiv2 and outputs the peak voltage Vpeak2 in accordance with the detected peak voltage. Here, the voltage-divided ratio for the reverse phase component Voutn is set to the same value as the voltage-divided ratio for the normal phase component Voutp. Thus, the capacitor 41 may have substantially the same capacitance as the capacitance of the capacitor 43. Further, the capacitor 45 may have substantially the same capacitance as the capacitance of the capacitor 47, and the capacitor 46 may have substantially the same capacitance as the capacitor 48.

Here, as described above, the signal strengths (amplitudes) of the high-frequency components of the detection signal Vm1 can be substantially equal to the signal strengths (amplitudes) of its low-frequency components, the signal strengths (amplitudes) of the low-frequency components of the voltage-divided signal Vdiv2 can be smaller than the signal strengths (amplitudes) of the low-frequency components of the detection signal Vm1, and the signal strengths (amplitudes) of the high-frequency components of the voltage-divided signal Vdiv2 can be substantially equal to the signal strengths (amplitudes) of the high-frequency components of the detection signal Vm1. As a result, the output circuit 1C can detect the peak voltage of the detection signal Vm1, where the detection signal Vm1 has signal components in a wide frequency range from a low frequency to a high frequency, and output the peak voltage Vpeak1 in accordance with the detected peak voltage of the detection signal Vm1. The output circuit 1C also can detect the peak voltage of the voltage-divided signal Vdiv2, where high frequency components are dominant in the spectrum of the voltage-divided signal Vdiv2, and output the peak voltage Vpeak2 in accordance with the detected peak voltage of the voltage-divided signal Vdiv2. Thus, by comparing the peak voltage Vpeak1 with the peak voltage Vpeak2, it is possible to estimate how much the low-frequency components of the detection signal Vm1 contributes to the peak voltage. Alternatively, for example, one of the peak voltage Vpeak1 and the peak voltage Vpeak2 can be selected and used in accordance with the spectrum of the output signal Vout.

The output circuit 1C can output the peak voltage Vpeak2 in addition to the peak voltage Vpeak1. The peak voltage Vpeak2 is a peak voltage according to the voltage-divided signal Vdiv2, and the voltage-divided ratio of the voltage-divided signal Vdiv2 to the output signal Vout is smaller than the voltage-divided ratio of the voltage-divided signal Vdiv1 to the output signal Vout. By comparing the comparison result of these different peak voltages with the comparison result of the frequency characteristics in the input signals of the peak detection circuit 6 and the peak detection circuit 7, it is possible to estimate the contribution of signal components in a specific frequency range (for example, the high-frequency components due to high-frequency peaking) to the peak voltage as described above. Alternatively, for example, one of the peak voltage Vpeak1 and the peak voltage Vpeak2 can be selected and used in accordance with the spectrum of the output signal Vout. For example, when the optical modulator is driven by the output signal Vout, the peak voltage may be selected in consideration of response characteristics (frequency characteristics) of an optical signal with respect to a driving signal of the optical modulator.

The voltage divider circuit 4C makes the signal strengths (amplitudes) of the high-frequency components of the voltage-divided signal Vdiv2 substantially equal to the signal strengths (amplitudes) of the high-frequency components of the detection signal Vm1, so that the voltage value of the detection signal Vm1 input to the transistors 61 and 62 of the peak detection circuit 6 and the voltage value of the voltage-divided signal Vdiv2 input to the transistors 71 and 72 of the peak detection circuit 7 can be suppressed to a predetermined voltage or less. Therefore, the transistors 61, 62, 71, and 72 can be operated with a margin with respect to each allowable voltage.

Figure 5:
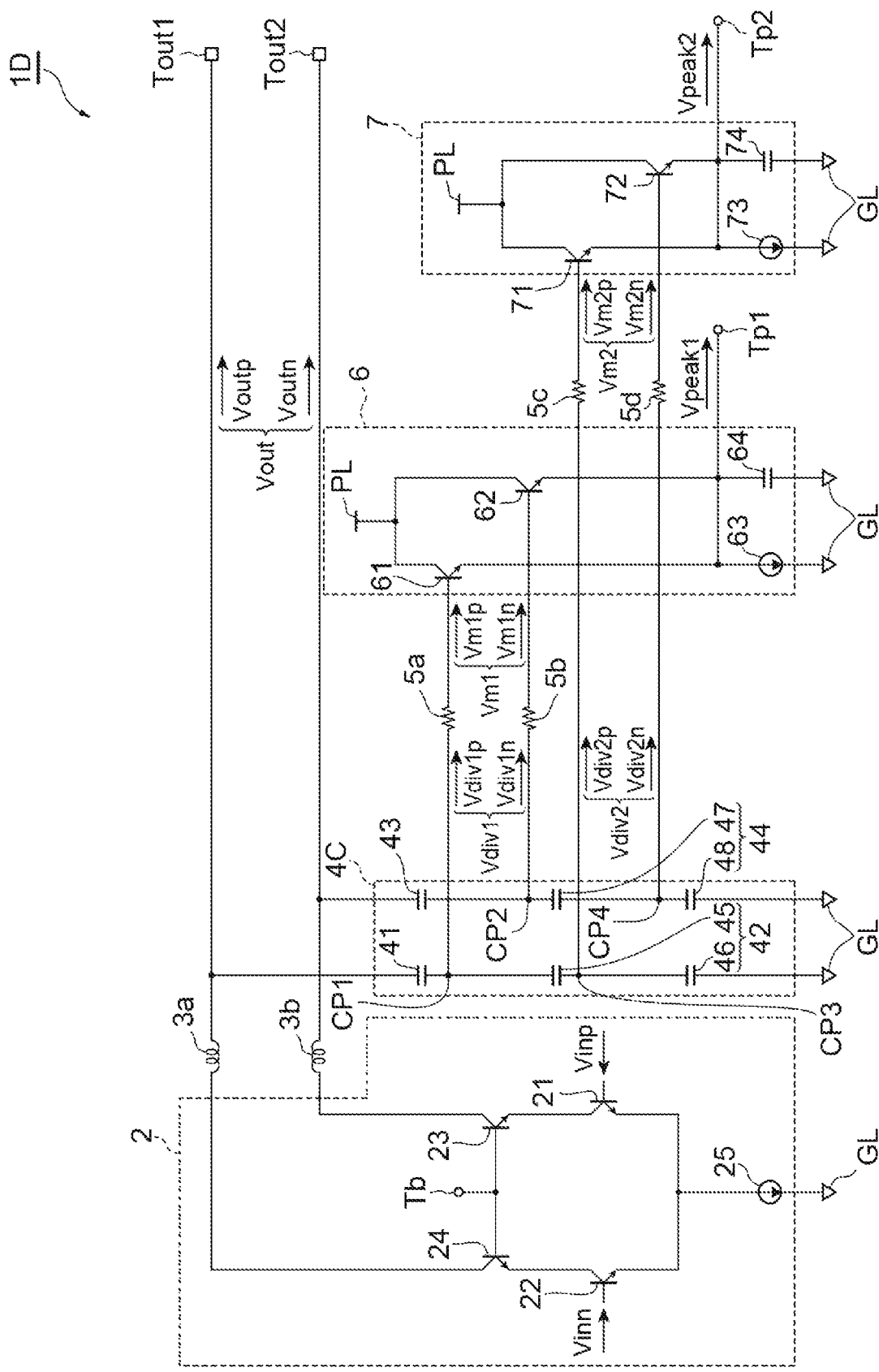
FIG. 5 illustrates a circuit configuration of an output circuit according to yet another embodiment.

Referring now to FIG. 5, an output circuit according to yet another embodiment will be described. FIG. 5 illustrates a circuit configuration of an output circuit according to yet another embodiment. An output circuit 1D shown in FIG. 5 is mainly different from the output circuit 1B in that the output circuit 1D includes a voltage divider circuit 4C in place of the voltage divider circuit 4, and in signals to be subjected to band adjustment by the band-adjusting elements 5c and 5d.

In the embodiment, the band-adjusting elements 5c and 5d are circuit elements for adjusting the band of the voltage-divided signal Vdiv2 to generate the detection signal Vm2. Specifically, the band-adjusting element 5c is used to adjust the band of the normal phase component Vdiv2p to generate the normal phase component Vm2p, and the band-adjusting element 5d is used to adjust the band of the reverse phase component Vdiv2n to generate the reverse phase component Vm2n.

The band-adjusting element 5c is electrically connected between the connection point CP3 and the peak detection circuit 7. Specifically, one end of the band-adjusting element 5c is electrically connected to the connection point CP3, and the other end of the band-adjusting element 5c is electrically connected to the base of the transistor 71. The band-adjusting element 5d is electrically connected between the connection point CP4 and the peak detection circuit 7. Specifically, one end of the band-adjusting element 5d is electrically connected to the connection point CP4, and the other end of the band-adjusting element 5d is electrically connected to the base of the transistor 72. The resistance values of the band-adjusting elements 5c and 5d may be different from the resistance values of the band-adjusting elements 5a and 5b. The resistance values of the band-adjusting elements 5c and 5d are, for example, 5 KΩ to 50 KΩ. The resistance value of the band-adjusting element 5c may be substantially the same as the resistance value of the band-adjusting element 5d.

Since a low-pass filter is formed by the band-adjusting element 5c and the input capacitance of the peak detection circuit 7, high-frequency components of the normal phase component Vdiv2p having frequencies higher than the cut-off frequency of the low-pass filter are reduced to generate the normal phase component Vm2p. Similarly, since a low-pass filter is formed by the band-adjusting element 5d and the input capacitance of the peak detection circuit 7, high-frequency components of the reverse phase component Vdiv2n having frequencies higher than the cut-off frequency of the low-pass filter is reduced to generate the reverse phase component Vm2n.

The cut-off frequencies of the low-pass filters are increased or decreased by adjusting the resistance values of the band-adjusting elements 5c and 5d, respectively. For example, when the resistance values of the band-adjusting elements 5c and 5d are increased, the cut-off frequencies are decreased, and when the resistance values of the band-adjusting elements 5c and 5d are decreased, the cut-off frequencies are increased. Accordingly, the band of the detection signal Vm2 is increased or decreased by adjusting the resistance values of the band-adjusting elements 5c and 5d. For example, when the band is narrowed by increasing the resistance values of the band-adjusting elements 5c and 5d, the high-frequency components due to the high-frequency peaking of the voltage-divided signal Vdiv2 are suppressed by the low-pass filters, and the spectrum of the detection signal Vm2 is flattened. When the band is widened by decreasing the resistance values of the band-adjusting elements 5a and 5b, the high-frequency peaked frequency components pass through the low-pass filters, and thus the spectrum of the detection signal Vm2 becomes similar to the spectrum of the voltage-divided signal Vdiv2 in which the high-frequency components are amplified by the high-frequency peaking.

Also in the output circuit 1D, the same effects as those of the output circuit 1B can be obtained for the configuration common to the output circuit 1B. Further, in the output circuit 1D, since the low-pass filter is formed by the band-adjusting element 5c and the input capacitance of the peak detection circuit 7, the high-frequency components of the normal phase component Vdiv2p having frequencies higher than the cut-off frequency of the low-pass filter are reduced to generate the normal phase component Vm2p. Similarly, since the low-pass filter is formed by the band-adjusting element 5d and the input capacitance of the peak detection circuit 7, the high-frequency components of the reverse phase component Vdiv2n having frequencies higher than the cut-off frequency of the low-pass filter are reduced to generate the reverse phase component Vm2n.

For example, the signal strengths (amplitudes) of the high-frequency components of the detection signal Vm1 can be substantially equal to the signal strengths (amplitudes) of its low-frequency components, the signal strengths (amplitudes) of the low-frequency components of the detection signal Vm2 can be smaller than the signal strengths (amplitudes) of the low-frequency components of the detection signal Vm1, and the signal strengths (amplitudes) of the high-frequency components of the detection signal Vm2 can be substantially equal to the signal strengths (amplitudes) of the high-frequency components of the detection signal Vm1. This makes it possible to detect a peak voltage of the detection signal Vm1, where the detection signal Vm1 has signal components from a low frequency to a high frequency, and output the peak voltage Vpeak1 in accordance with the detected peak voltage, and to detect a peak voltage of the detection signal Vm2, where high frequency components are dominant in the spectrum of the detection signal Vm2, and output the peak voltage Vpeak2 in accordance with the detected peak voltage.

By making the resistance values of the band-adjusting elements 5c and 5d different from the resistance values of the band-adjusting elements 5a and 5b, it is possible to adjust the spectrum of the detection signal Vm2 to a spectrum different from the spectrum of the detection signal Vm1. For example, while the spectrum of the detection signal Vm1 is a widely flat spectrum from a low frequency to a high frequency, the spectrum of the detection signal Vm2 can be a spectrum in which high-frequency components are larger than low-frequency components (however, the spectrum of the detection signal Vm2 is flatter than the spectrum of the output signal Vout). Therefore, by comparing the peak voltage Vpeak1 with the peak voltage Vpeak2, it is possible to estimate how much the low-frequency components of the detection signal Vm1 contribute to the peak voltage. Alternatively, for example, one of the peak voltage Vpeak1 and the peak voltage Vpeak2 can be selected and used in accordance with the spectrum of the output signal Vout. For example, when the optical modulator is driven by the output signal Vout, the peak voltage may be selected in consideration of response characteristics (frequency characteristics) of an optical signal with respect to a driving signal of the optical modulator.

Figure 6:
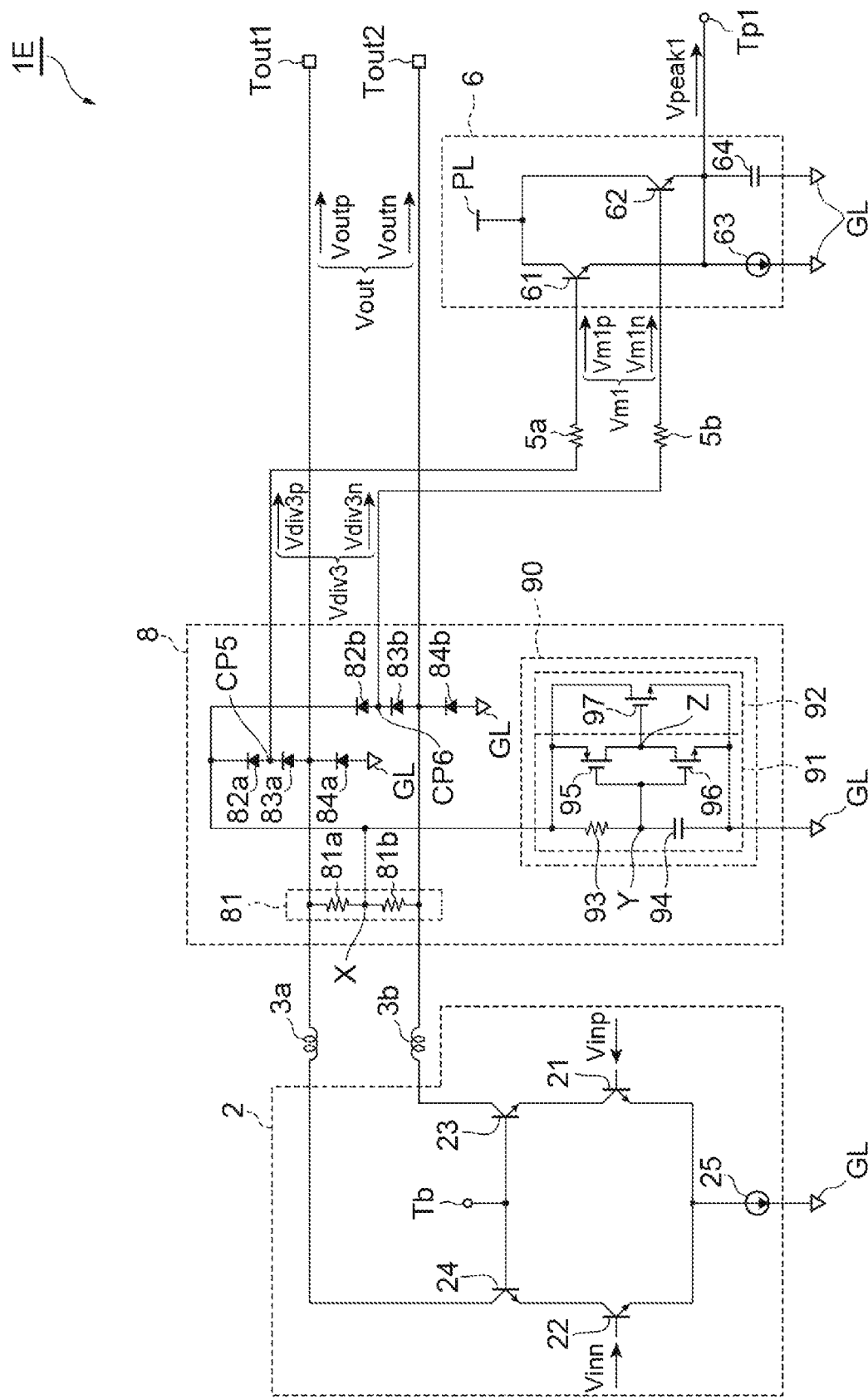
FIG. 6 illustrates a circuit configuration of an output circuit according to yet another embodiment.

Referring now to FIG. 6, an output circuit according to yet another embodiment will be described. FIG. 6 illustrates a circuit configuration of an output circuit according to yet another embodiment. An output circuit 1E shown in FIG. 6 is mainly different from the output circuit 1 in that the output circuit 1E includes an electrostatic discharge (ESD) protection circuit 8 instead of the voltage divider circuit 4 and in the signals to be subjected to band adjustment by the band-adjusting elements 5a and 5b.

The ESD protection circuit 8 is a circuit for protecting an internal circuit (for example, the amplifier circuit 2) of the output circuit 1E from static electricity. The ESD protection circuit 8 is provided, for example, between the amplifier circuit 2 and the output terminals Tout1 and Tout2. Note that the ESD protection circuit 8 may be provided between the inductors 3a and 3b and the output terminals Tout1 and Tout2. The ESD protection circuit 8 includes a potential generation circuit 81, diodes 82a, 82b, 83a, 83b, 84a, and 84b, and a clamp circuit 90. In the following description of the ESD protection circuit, with respect to the "potential", the reference potential is referred to as a ground potential. Further, with respect to the "voltage", the reference potential is treated as the ground potential unless otherwise specified. Therefore, "potential" and "voltage" may be considered to be equivalent. For example, the term "potential" may be used to represent the height of a voltage from a reference potential, and the term "voltage" may be simply used to indicate that the physical quantity is a voltage.

The potential generation circuit 81 is a circuit that generates a midpoint potential between the voltage of the output terminal Tout1 and the voltage of the output terminal Tout2. The potential generation circuit 81 includes resistance elements 81a and 81b. The resistance element 81a and the resistance element 81b are connected in series to each other between the output terminal Tout1 and the output terminal Tout2. Specifically, one end of the resistance element 81a is electrically connected to the output terminal Tout1. The other end of the resistance element 81a is electrically connected to one end of the resistance element 81b. The other end of the resistance element 81b is electrically connected to the output terminal Tout2. Note that "one end" and "the other end" of the resistance element are convenient distinctions between the two terminals of the resistance element for describing connection with another circuit element, and in the above description, "one end" and "the other end" of the resistance element may be replaced with each other for connection. The resistance value of the resistance element 81a is substantially equal to the resistance value of the resistance element 81b. "Substantially equal" means that the values may be different from each other within a practically acceptable error range. For example, the acceptable error range is within a relative error of 5%. The resistance values of the resistance elements 81a and 81b are, for example, 2 KΩ to 20 KΩ.

The potential generation circuit 81 generates the midpoint potential between the voltage of the output terminal Tout1 and the voltage of the output terminal Tout2 at a connection point X between the other end of the resistance element 81a and one end of the resistance element 81b. For example, assuming that the reference potential of the output signal Vout is the ground potential (0 V), when the voltage of the normal phase component Voutp of the output signal Vout is a peak voltage and the voltage of the reverse phase component Voutn of the output signal Vout is a bottom voltage, the voltage of the connection point X is greater than the bottom voltage and less than the peak voltage. When ESD does not occur (when the internal circuit of the output circuit 1E is in an equilibrium state (non-modulation state) or when a modulation operation is performed), the midpoint potential is also referred to as an output common mode voltage. For example, when the resistance value of the resistance element 81a is equal to the resistance value of the resistance element 81b, the voltage of the connection point X is an average voltage of the voltage of the normal phase component Voutp and the voltage of the reverse phase component Voutn. The normal phase component Voutp and the reverse phase component Voutn of the output signal Vout are complementary signals to each other, and when the respective phases are inverted to each other, the midpoint potential becomes a substantially constant value with respect to time even if the output signal Vout changes to transmit information.

The diodes 82a, 82b, 83a, 83b, 84a, and 84b are ESD protection diodes for protecting the amplifier circuit 2 from static electricity. The diode 82a and the diode 83a are connected in series between the connection point X and the output terminal Tout1. Specifically, a cathode of the diode 82a is electrically connected to the connection point X. An anode of the diode 82a is electrically connected to a cathode of the diode 83a. An anode of the diode 83a is electrically connected to the output terminal Tout1.

The diode 82b and the diode 83b are connected in series between the connection point X and the output terminal Tout2. Specifically, a cathode of the diode 82b is electrically connected to the connection point X. An anode of the diode 82b is electrically connected to a cathode of the diode 83b. An anode of the diode 83b is electrically connected to the output terminal Tout2. The diodes 82a, 82b, 83a, and 83b are, for example, PN junction diodes each formed in a P-type well. The diodes 82a, 82b, 83a, and 83b serve as discharge paths when a positive ESD voltage is generated at the output terminals Tout1 and Tout2. The electrical characteristics of the diodes 82a, 82b, 83a, and 83b are set such that no current flows into the diodes 82a, 82b, 83a, and 83b when the output circuit 1E operates normally and outputs a predetermined output signal Vout.

A cathode of the diode 84a is electrically connected to the output terminal Tout1. An anode of the diode 84a is electrically connected to the grounding wire GL. A cathode of the diode 84b is electrically connected to the output terminal Tout2. An anode of the diode 84b is electrically connected to the grounding wire GL. The diodes 84a and 84b are, for example, PN junction diodes each formed in an N-type well. The diodes 84a and 84b serve as discharge paths when a negative ESD voltage is generated at the output terminals Tout1 and Tout2. The voltage of the output signal Vout is a positive voltage with reference to the ground potential in the normal operation of the output circuit 1E, so that no current flows into the diodes 84a and 84b.

The clamp circuit 90 is a circuit for preventing dielectric breakdown of an internal circuit in the output circuit 1E by releasing an ESD current at the output terminals Tout1 and Tout2 to the ground potential to suppress an increase in potential. The clamp circuit 90 connects the connection point X to the ground potential via the grounding wire GL when a positive ESD voltage is generated at the connection point X. The positive ESD voltage is, for example, a voltage that is 10 times or more larger than the peak voltage of the output signal Vout when the output circuit 1E is performing a normal operation. The clamp circuit 90 adopts a configuration in which circuit elements are selected and circuit design is performed so as to withstand an applied voltage at the time of the ESD protection operation. The clamp circuit 90 includes a detection circuit 91 and a switching circuit 92.

The detection circuit 91 is a circuit that detects an ESD voltage based on the midpoint potential. The detection circuit 91 includes a resistance element 93, a capacitor 94, and metal-oxide-semiconductor (MOS) transistors 95 and 96. The resistance element 93 and the capacitor 94 are connected in series between the connection point X and the grounding wire GL, and constitute a low-pass filter. Specifically, one end of the resistance element 93 is electrically connected to the connection point X. The other end of the resistance element 93 is electrically connected to one end of the capacitor 94. The other end of the capacitor 94 is electrically connected to the grounding wire GL. For example, when a voltage pulse changing stepwise is generated at the connection point X due to ESD, a voltage of about 63% of the voltage at the connection point X is generated at a connection point Y between the other end of the resistance element 93 and the one end of the capacitor 94 after a delay time of about a time constant determined by the product of the resistance value of the resistance element 93 and the capacitance of the capacitor 94, and then at last the voltage at a connection point Y becomes substantially the same as the voltage at the connection point X.

The MOS transistors 95 and 96 constitute an inverter circuit (inverting circuit). The MOS transistor 95 is, for example, a P-type MOS transistor. The MOS transistor 96 is, for example, an N-type MOS transistor. A source of the MOS transistor 95 is electrically connected to the connection point X. A source of the MOS transistor 96 is electrically connected to the grounding wire GL. A drain of the MOS transistor 95 and a drain of the MOS transistor 96 are electrically connected to each other at a connection point Z. A gate of the MOS transistor 95 and a gate of the MOS transistor 96 are electrically connected to each other and further electrically connected to the connection point Y.

In this inverter circuit, when a voltage is generated at the connection point X and the voltage at the connection point Y is lower than the threshold voltage of the inverter circuit, the MOS transistor 95 is turned on and the output at the connection point Z of the inverter circuit becomes a voltage substantially equal to that at the connection point X. On the other hand, when the voltage at the connection point Y is higher than the threshold voltage, the MOS transistor 96 is turned on, and the output of the inverter circuit becomes a voltage substantially equal to the ground potential supplied to the grounding wire GL. Here, in the embodiment, the inverter circuit has a configuration of one stage, but may have a configuration of an odd number of stages of three or more stages.

The switching circuit 92 is a circuit that is turned on and off in accordance with the output of the inverter circuit. The switching circuit 92 includes a MOS transistor 97. The MOS transistor 97 is, for example, an N-type MOS transistor. A drain of the MOS transistor 97 is electrically connected to the connection point X. A source of the MOS transistor 97 is electrically connected to the grounding wire GL. A gate of the MOS transistor 97 is electrically connected to the connection point Z.

When the gate-source voltage of the MOS transistor 97 is higher than the threshold voltage of the MOS transistor 97, the MOS transistor 97 is turned on and operates so as to reduce the drain-source resistance. On the other hand, when the gate-source voltage of the MOS transistor 97 is lower than the threshold voltage of the MOS transistor 97, the MOS transistor 97 is turned off and operates so as to increase the drain-source resistance. With such a configuration, the MOS transistor 97 switches in accordance with the potential of the connection point X using the potential of the connection point Y as a trigger, and functions to connect the connection point X to the ground potential with a low resistance when the potential of the connection point X rises.

Each of the diodes 82a, 82b, 83a, 83b, 84a, and 84b has parasitic capacitance. Accordingly, at a connection point CP5 between the anode of the diode 82a and the cathode of the diode 83a, the potential difference between the potential of the output terminal Tout1 and the midpoint potential is divided by the parasitic capacitance of the diode 82a and the parasitic capacitance of the diode 83a to generate a normal phase component Vdiv3p. Similarly, at a connection point CP6 between the anode of the diode 82b and the cathode of the diode 83b, the potential difference between the potential of the output terminal Tout2 and the midpoint potential is divided by the parasitic capacitance of the diode 82b and the parasitic capacitance of the diode 83b to generate a reverse phase component Vdiv3n. That is, the diodes 82a, 82b, 83a, and 83b constitute a voltage divider circuit, and divide the output signal Vout to generate a voltage-divided signal Vdiv3 (first voltage-divided signal) including the normal phase component Vdiv3p and the reverse phase component Vdiv3n.

In this embodiment, the band-adjusting elements 5a and 5b are circuit elements for adjusting the band of the voltage-divided signal Vdiv3 to generate the detection signal Vm1. Specifically, the band-adjusting element 5a is used to adjust the band of the normal phase component Vdiv3p to generate the normal phase component Vm1p, and the band-adjusting element 5b is used to adjust the band of the reverse phase component Vdiv3n to generate the reverse phase component Vm1n.

The band-adjusting element 5a is electrically connected between the connection point CP5 and the peak detection circuit 6. Specifically, one end of the band-adjusting element 5a is electrically connected to the connection point CP5, and the other end of the band-adjusting element 5a is electrically connected to the base of the transistor 61. The band-adjusting element 5b is electrically connected between the connection point CP6 and the peak detection circuit 6. Specifically, one end of the band-adjusting element 5b is electrically connected to the connection point CP6, and the other end of the band-adjusting element 5b is electrically connected to the base of the transistor 62. The resistance values of the band-adjusting elements 5a and 5b are, for example, 1 KΩ to 10 KΩ. The resistance value of the band-adjusting element 5b may be substantially the same as the resistance value of the band-adjusting element 5a.

Since a low-pass filter is formed by the band-adjusting element 5a and the input capacitance of the peak detection circuit 6, high-frequency components of the normal phase component Vdiv3p having frequencies higher than the cut-off frequency of the low-pass filter are reduced to generate the normal phase component Vm1p. Similarly, since a low-pass filter is formed by the band-adjusting element 5b and the input capacitance of the peak detection circuit 6, high-frequency components of the reverse phase component Vdiv3n having frequencies higher than the cut-off frequency of the low-pass filter are reduced to generate the reverse phase component Vm1n.

The cut-off frequencies of the low-pass filters are increased or decreased by adjusting the resistance values of the band-adjusting elements 5a and 5b, respectively. For example, when the resistance values of the band-adjusting elements 5a and 5b are increased, the cut-off frequencies are decreased, and when the resistance values of the band-adjusting elements 5a and 5b are decreased, the cut-off frequencies are increased. Accordingly, the band of the detection signal Vm1 is increased or decreased by adjusting the resistance values of the band-adjusting elements 5a and 5b. For example, when the band is narrowed by increasing the resistance values of the band-adjusting elements 5a and 5b, the high-frequency components due to the high-frequency peaking of the voltage-divided signal Vdiv3 are suppressed by the low-pass filters, and the spectrum of the detection signal Vm1 is flattened. When the band is widened by decreasing the resistance values of the band-adjusting elements 5a and 5b, the high-frequency peaked frequency components pass through the low-pass filters, and thus the spectrum of the detection signal Vm1 becomes similar to the spectrum of the voltage-divided signal Vdiv3 in which the high-frequency components are amplified by the high-frequency peaking.

Also in the output circuit 1E, the same effects as those of the output circuit 1 can be obtained for the configuration common to the output circuit 1. Further, in the output circuit 1E, the normal phase component Vdiv3$p$ is generated by the diode 82a and the diode 83a, and the reverse phase component Vdiv3$n$ is generated by the diode 82b and the diode 83b. In this configuration, the output signal Vout can be divided by using the diodes 82a, 82b, 83a, and 83b used for ESD protection. Therefore, since there is no need to provide a dedicated circuit element for the voltage divider circuit, the circuit scale of the output circuit 1E can be reduced.

Figure 7:
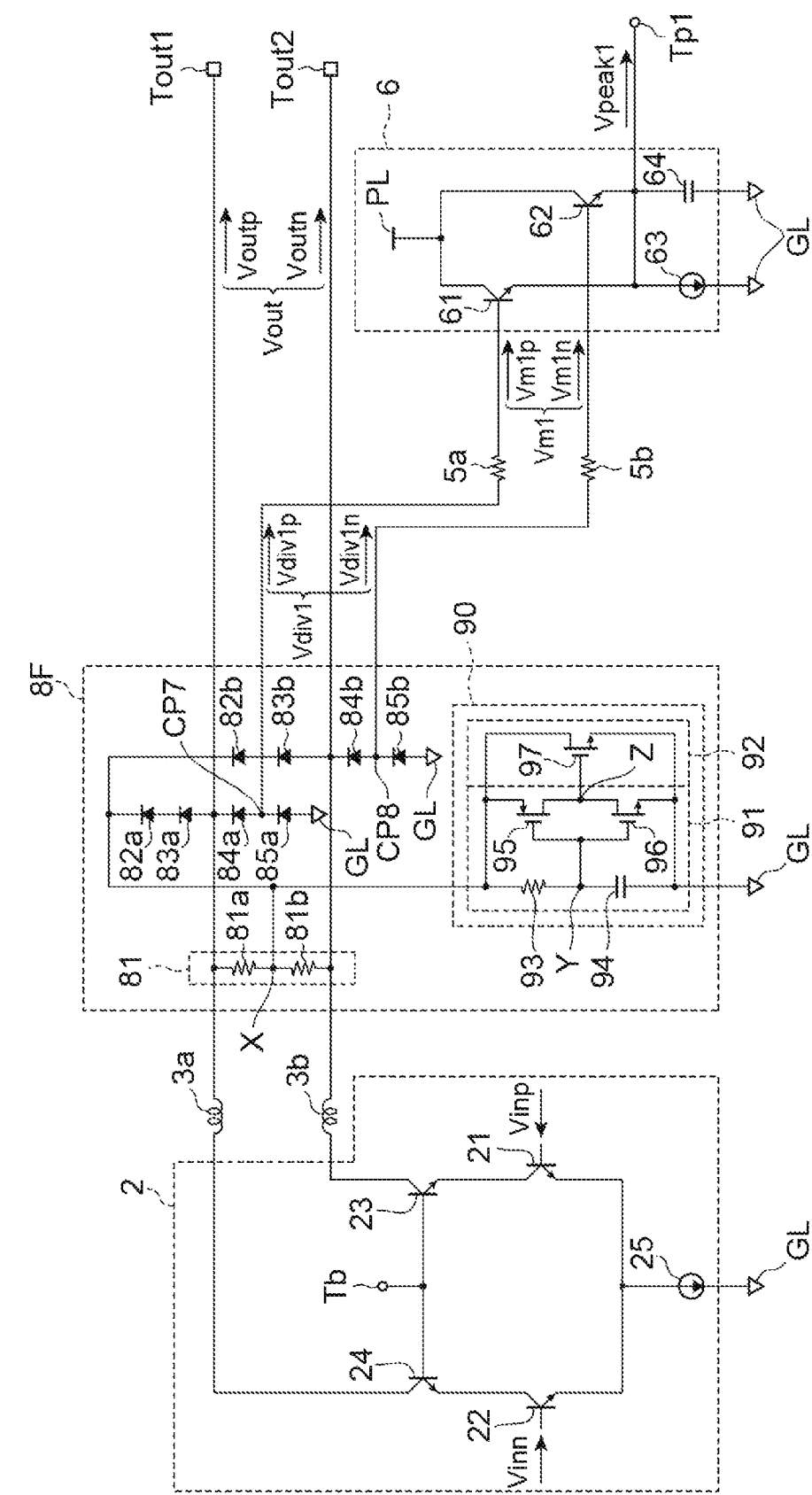
FIG. 7 illustrates a circuit configuration of an output circuit according to yet another embodiment.

Referring now to FIG. 7, an output circuit according to yet another embodiment will be described. FIG. 7 illustrates a circuit configuration of an output circuit according to yet another embodiment. An output circuit 1F shown in FIG. 7 is mainly different from the output circuit 1E in that the output circuit 1F includes an ESD protection circuit 8F in place of the ESD protection circuit 8, and in signals to be subjected to band adjustment by the band-adjusting elements 5a and 5b. The ESD protection circuit 8F is mainly different from the ESD protection circuit 8 in that the ESD protection circuit 8F further includes diodes 85a and 85b.

The diodes 85a and 85b are ESD protection diodes for protecting the amplifier circuit 2 from static electricity. A cathode of the diode 85a is electrically connected to the anode of the diode 84a. An anode of the diode 85a is electrically connected to the grounding wire GL. That is, the diode 84a and the diode 85a are connected in series between the output terminal Tout1 and the grounding wire GL. A cathode of the diode 85b is electrically connected to the anode of the diode 84b. An anode of the diode 85b is electrically connected to the grounding wire GL. That is, the diode 84b and the diode 85b are connected in series between the output terminal Tout2 and the grounding wire GL.

Each of the diodes 84a, 84b, 85a, and 85b has parasitic capacitance. Accordingly, at a connection point CP7 between the anode of the diode 84a and the cathode of the diode 85a, the normal phase component Voutp is divided by the parasitic capacitance of the diode 84a and the parasitic capacitance of the diode 85a to generate the normal phase component Vdiv1$p$. Similarly, at a connection point CP8 between the anode of the diode 84b and the cathode of the diode 85b, the reverse phase component Voutn is divided by the parasitic capacitance of the diode 84b and the parasitic capacitance of the diode 85b to generate the reverse phase component Vdiv1$n$. That is, the diodes 84a, 84b, 85a, and 85b constitute a voltage divider circuit, which divides the output signal Vout to generate the voltage-divided signal Vdiv1.

In the embodiment, the band-adjusting elements 5a and 5b are circuit elements for adjusting the band of the voltage-divided signal Vdiv1 to generate the detection signal Vm1. Specifically, the band-adjusting element 5a is used to adjust the band of the normal phase component Vdiv1$p$ to generate the normal phase component Vm1$p$, and the band-adjusting element 5b is used to adjust the band of the reverse phase component Vdiv1$n$ to generate the reverse phase component Vm1$n$.

The band-adjusting element 5a is electrically connected between the connection point CP7 and the peak detection circuit 6. Specifically, one end of the band-adjusting element 5a is electrically connected to the connection point CP7, and the other end of the band-adjusting element 5a is electrically connected to the base of the transistor 61. The band-adjusting element 5b is electrically connected between the connection point CP8 and the peak detection circuit 6. Specifically, one end of the band-adjusting element 5b is electrically connected to the connection point CP8, and the other end of the band-adjusting element 5b is electrically connected to the base of the transistor 62. The resistance values of the band-adjusting elements 5a and 5b are, for example, 1 KΩ to 10 KΩ. The resistance value of the band-adjusting element 5b may be substantially the same as the resistance value of the band-adjusting element 5a.

Since a low-pass filter is formed by the band-adjusting element 5a and the input capacitance of the peak detection circuit 6, high-frequency components of the normal phase component Vdiv1$p$ having frequencies higher than the cut-off frequency of the low-pass filter are reduced to generate the normal phase component Vm1$p$. Similarly, since a low-pass filter is formed by the band-adjusting element 5b and the input capacitance of the peak detection circuit 6, high-frequency components of the reverse phase component Vdiv1$n$ having frequencies higher than the cut-off frequency of the low-pass filter are reduced to generate the reverse phase component Vm1$n$.

The cut-off frequencies of the low-pass filters are increased or decreased by adjusting the resistance values of the band-adjusting elements 5a and 5b, respectively. For example, when the resistance values of the band-adjusting elements 5a and 5b are increased, the cut-off frequencies are decreased, and when the resistance values of the band-adjusting elements 5a and 5b are decreased, the cut-off frequencies are increased. Accordingly, the band of the detection signal Vm1 is increased or decreased by adjusting the resistance values of the band-adjusting elements 5a and 5b. For example, when the band is narrowed by increasing the resistance values of the band-adjusting elements 5a and 5b, the high-frequency components due to the high-frequency peaking of the voltage-divided signal Vdiv1 are suppressed by the low-pass filters, and the spectrum of the detection signal Vm1 is flattened. When the band is widened by decreasing the resistance values of the band-adjusting elements 5a and 5b, the high-frequency peaked frequency components pass through the low-pass filters, and thus the spectrum of the detection signal Vm1 becomes similar to the spectrum of the voltage-divided signal Vdiv1 in which the high-frequency components are amplified by the high-frequency peaking.

Also in the output circuit 1F, the same effects as those of the output circuit 1E can be obtained for the configuration common to the output circuit 1E. Further, in the output circuit 1F, the normal phase component Vdiv1$p$ is generated by the diode 84a and the diode 85a, and the reverse phase component Vdiv1n is generated by the diode 84b and the diode 85b. In other words, the capacitors 41 and 42 in the output circuit 1 correspond to the diodes 84a and 85a, respectively, and the capacitors 43 and 44 in the output circuit 1 correspond to the diodes 84b and 85b, respectively. Also in this configuration, the output signal Vout can be divided by using the diodes 84a, 84b, 85a, and 85b used for ESD protection. Therefore, since there is no need to provide a dedicated circuit element for the voltage divider circuit, the circuit scale of the output circuit 1F can be reduced.

It should be noted that the output circuit according to the present disclosure is not limited to the above embodiments.

Although the bipolar transistors are used as the transistors 21, 22, 23, 24, 61, 62, 71, and 72 in the above embodiments, the transistors 21, 22, 23, 24, 61, 62, 71, and 72 may be field effect transistors (FETs). In this case, the base, the emitter, and the collector of the bipolar transistor are replaced with the gate, the source, and the drain, respectively. The NPN-type bipolar transistor can be read as an N-channel FET. When the field effect transistors are used as the transistors 21, 22, 23, and 24, the amplifier circuit 2 is referred to as an open-drain amplifier circuit.

In the embodiments described above, the amplifier circuit 2 outputs the output signal Vout via the inductors 3a and 3b, but may output a single-phase output signal. In this case, each of the output circuits 1, 1A, 1B, 1C, 1D, 1E, and 1F may have a single-phase circuit configuration. For example, when only the normal phase component Voutp is output as the single-phase output signal, the output terminal Tout2, the inductor 3b, the capacitors 43 and 44, the band-adjusting element 5b, and the transistor 62 may be omitted from the output circuit 1. In this case, in order to stabilize the operation of the transistor 23, the collector of the transistor 23 may be connected to the power supply wiring PL via a load resistor. The resistance value of the load resistor may be the same as the resistance value of an external termination resistor connected to the output terminal Tout1.

Figure 8:
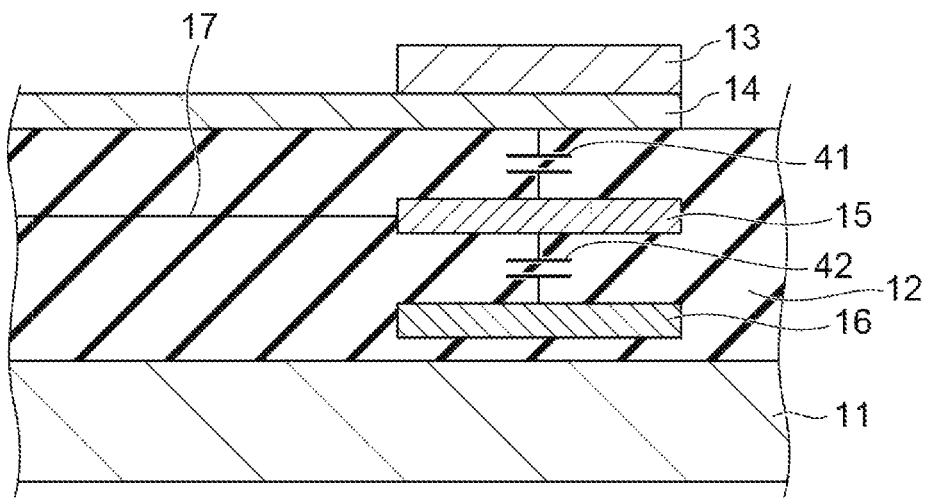
FIG. 8 illustrates an example configuration of a voltage divider circuit.

Each of the capacitors 41, 42, 43, 44, 45, 46, 47, and 48 may be constituted by a component, or may be constituted by two metal plates, such as electrodes and wires formed on a semiconductor substrate, facing each other with an insulating layer interposed therebetween. Referring to FIG. 8, an example in which each of the capacitors 41 and 42 is constituted by two metal plates will be described.

FIG. 8 illustrates an example configuration of a voltage divider circuit. When the output circuit 1 is configured as an IC, the output circuit 1 includes a semiconductor substrate 11, an insulating layer 12 provided on the semiconductor substrate 11, a multilayer wiring formed in the insulating layer 12, and an electrode pad 13. The semiconductor substrate 11 is, for example, a silicon substrate. The electrode pad 13 is a flat metal plate that is provided above the semiconductor substrate 11 and functions as the output terminal Tout1. The electrode pad 13 is used to connect, for example, a bonding wire. A wiring layer including a connection line 14, a wiring layer including an electrode 15 (first metal plate), and a wiring layer including a shield wiring 16 (second metal plate) are formed in the insulating layer 12, and are arranged in this order from the output terminal Tout1 toward the semiconductor substrate 11. The insulating layer 12 may include a plurality of insulating layers stacked from the semiconductor substrate 11 toward the electrode pad 13, and each wiring layer may be formed between the plurality of insulating layers. An upper surface of the connection line 14 may be covered with a protective film (insulating film). The protective film protects the connection line 14 from the outside. In this case, the electrode pad 13 is formed so as to be exposed from the protective film.

The connection line 14 is, for example, a wiring pattern that connects the output terminal Tout1 and the inductor 3a. A part of the connection line 14 may be formed as the electrode pad 13. The electrode 15 is a flat metal plate that is provided above the semiconductor substrate 11 and functions as the connection point CP1. A wiring pattern 17 that connects the electrode 15 and the band-adjusting element 5a is connected to the electrode 15. The electrode 15 outputs the voltage-divided signal Vdiv1 to the band-adjusting element 5a through the wiring pattern 17. The shield wiring 16 is a flat metal plate that is provided above the semiconductor substrate 11 and functions as the grounding wire GL. That is, the grounding wire GL may be formed to include the shield wiring 16.

In the configuration shown in FIG. 8, the electrode pad 13 and the electrode 15 are disposed to face each other in a stacking direction. The stacking direction indicates a direction in which the insulating film 12, the shield wiring 16, the electrode 15, the connection line 14, and the electrode pad 13 are stacked above the semiconductor substrate 11. Each of the electrode pad 13 and the electrode 15 has, for example, a flat plate shape. Therefore, the electrode pad 13 and the electrode 15 are formed as parallel flat plates to form the capacitor 41. More specifically, the electrode 15 is disposed to face the electrode pad 13 with an insulating layer interposed between the electrode 15 and the electrode pad 13. Thus, the capacitor 41 includes the electrode pad 13, the electrode 15, and the insulating layer interposed between the electrode pad 13 and the electrode 15. The shield wiring 16 has, for example, a flat plate shape. The electrode 15 and the shield wiring 16 are disposed to face each other in the stacking direction. Therefore, the electrode 15 and the shield wiring 16 are formed as parallel flat plates, thereby forming the capacitor 42. More specifically, the shield wiring 16 is disposed to face the electrode 15 with an insulating layer interposed between the shield wiring 16 and the electrode 15. Thus, the capacitor 42 includes the electrode 15, the shield wiring 16, and the insulating layer interposed between the electrode 15 and the shield wiring 16.

The capacitance C1 of the capacitor 41 is set by adjusting the area of the electrode pad 13, the area of the electrode 15, and the distance between the electrode pad 13 and electrode 15. More specifically, the value of the capacitance C1 can be adjusted by changing the size of the area of the overlapping portion between the pattern of the electrode pad 13 and the pattern of the electrode 15 when the electrode pad 13 and the electrode 15 are viewed from the stacking direction (i.e., in a plan view). Similarly, the capacitance C2 of the capacitor 42 is set by adjusting the area of the electrode 15, the area of the shield wiring 16, and the distance between the electrode 15 and the shield wiring 16. More specifically, the value of the capacitance C2 can be adjusted by changing the size of the area of the overlapping portion between the pattern of the electrode 15 and the pattern of the shield wiring 16 in the above-described plan view. As shown in Equation (3), a capacitance Cpad of the electrode pad 13 is obtained as a combined capacitance of the capacitance C1 and the capacitance C2.

[Equation 3]

$$Cpad = \frac{C1 \times C2}{C1 + C2} \quad (3)$$

In the above configuration, each of the capacitance C1 and C2 is, for example, about 100 fF to 400 fF. At this time, the capacitance Cpad is about 50 fF to 200 fF. When the area of the electrode 15 is smaller than the area of the electrode pad 13, Equation (3) may not be satisfied. In order to reduce the influence of parasitic capacitance of the wiring pattern 17, the band-adjusting element 5a may be arranged close to the electrode 15.

In the above configuration, it is not necessary to configure the capacitors 41 and 42 as dedicated electronic components, so that it is possible to reduce the circuit scale of the output circuit 1.

The capacitor 41 may be formed by the electrode pad 13 and the electrode 15, and the capacitor 42 may be configured as an electronic component. The capacitor 41 may be configured as an electronic component, and the capacitor 42 may be formed by the electrode 15 and the shield wiring 16. In other words, at least one of the capacitor 41 and the capacitor 42 may be constituted by the electrode 15 and one of the electrode pad 13 and the shield wiring 16. The other capacitors may be configured similarly to the capacitors 41 and 42. Since it is not necessary to configure at least one of the capacitors as a dedicated electronic component, the circuit scale of the output circuit 1 can be reduced. The similar configuration can be adopted in the output circuits 1A, 1B, 1C, and 1D.

Figure 9:
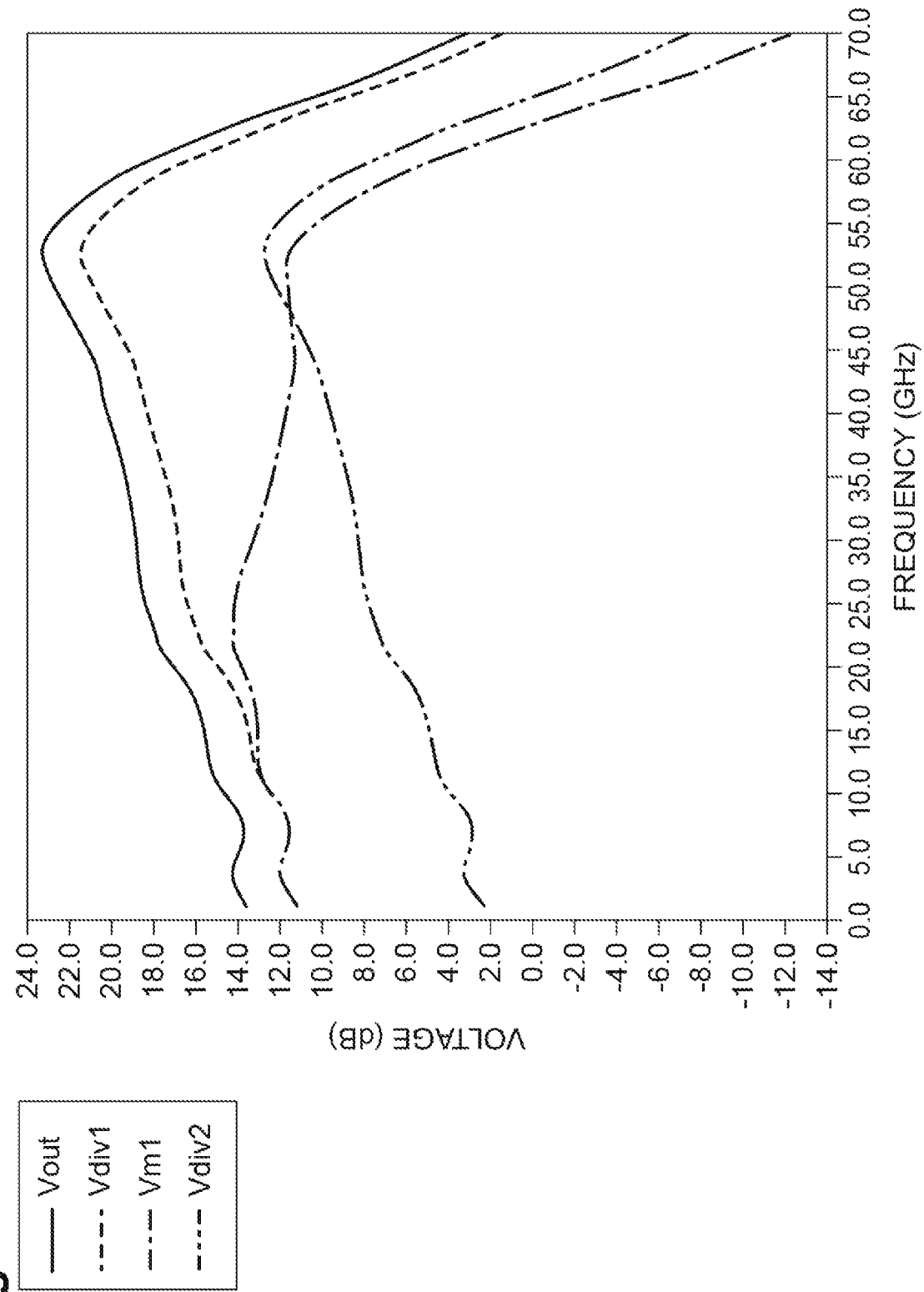
FIG. 9 illustrates frequency characteristics of various portions of the output circuit shown in FIG. 4.

Referring now to FIG. 9, frequency characteristics of each part of the output circuit 1C will be described in detail. FIG. 9 illustrates frequency characteristics of each signal in the output circuit shown in FIG. 4. Note that the unit of the vertical axis is decibels based on the voltage amplitude at the frequency of 1 GHz of the signals. Frequency characteristics obtained by circuit simulation are shown for each signal of the output signal Vout, the voltage-divided signal Vdiv1, the detection signal Vm1, and the voltage-divided signal Vdiv2. In the circuit simulation, the capacitance C1 of the capacitor 41 was set to about 10 fF, the capacitance C3 of the capacitor 43 was set to about 10 fF, the capacitance C5 of the capacitor 45 was set to about 25 fF, the capacitance C6 of the capacitor 46 was set to about 25 fF, the capacitance C7 of the capacitor 47 was set to about 25 fF, and the capacitance C8 of the capacitor 48 was set to about 25 fF. The resistance value R1 of the band-adjusting element 5a was set to about 2 KΩ, and the resistance value R2 of the band-adjusting element 5b was set to about 2 KΩ.

As shown in FIG. 9, in each of the output signal Vout, the voltage-divided signal Vdiv1, and the voltage-divided signal Vdiv2, the signal strength (voltage amplitude) is low in a low-frequency band (for example, a range less than 30 GHz) and has a peak value at frequency of about 53 GHz. Therefore, the peak detection circuit 7 to which the voltage-divided signal Vdiv2 is input can detect the peak voltage of the high-frequency components. On the other hand, in the peak detection circuit 6 to which the detection signal Vm1 is input, the signal strength (voltage amplitude) is flat in a wide frequency band from the low-frequency 1 GHz to the high-frequency 50 GHz. Therefore, it is possible to detect a peak voltage composed of a spectrum flattened in a wide band from a low frequency to a high frequency.

What is claimed is:

1. An output circuit comprising:
   an amplifier circuit having an output node;
   an output terminal configured to output an output signal to an outside;
   an inductor having a first terminal and a second terminal, the first terminal being connected to the output node of the amplifier circuit, the second terminal being connected to the output terminal;
   a voltage divider circuit connected between the second terminal of the inductor and a grounding wire, the voltage divider circuit including a series circuit constituted by a first capacitive element and a second capacitive element connected in series to the first capacitive element, the series circuit being configured to generate a first voltage-divided signal by dividing a voltage of the output signal;
   a first band-adjusting element having a resistance component for generating a first band-adjusted signal by adjusting frequency characteristics of the first voltage-divided signal; and
   a first peak detection circuit configured to detect a peak voltage of the first band-adjusted signal and output a first peak voltage in accordance with the detected peak voltage.

2. The output circuit according to claim 1, further comprising a second peak detection circuit configured to output a second peak voltage in accordance with the first voltage-divided signal.

3. The output circuit according to claim 2,
   wherein the second peak detection circuit is configured to detect a peak voltage of the first voltage-divided signal and output the second peak voltage in accordance with the detected peak voltage of the first voltage-divided signal.

4. The output circuit according to claim 2, further comprising a second band-adjusting element having a resistance component for generating a second band-adjusted signal by adjusting frequency characteristics of the first voltage-divided signal,
   wherein the second peak detection circuit is configured to detect a peak voltage of the second band-adjusted signal and output the second peak voltage in accordance with the detected peak voltage of the second band-adjusted signal.

5. The output circuit according to claim 1, further comprising a second peak detection circuit configured to output a second peak voltage,
   wherein the second capacitive element includes a third capacitive element and a fourth capacitive element connected in series to the third capacitive element,
   wherein the voltage divider circuit is configured to generate a second voltage-divided signal at a connection point by dividing the voltage of the output signal, the connection point being between the third capacitive element and the fourth capacitive element, and
   wherein the second peak detection circuit is configured to output the second peak voltage in accordance with the second voltage-divided signal.

6. The output circuit according to claim 5,
   wherein the second peak detection circuit is configured to detect a peak voltage of the second voltage-divided signal and output the second peak voltage in accordance with the detected peak voltage of the second voltage-divided signal.

7. The output circuit according to claim 5, further comprising a second band-adjusting element having a resistance component for generating a second band-adjusted signal by adjusting frequency characteristics of the second voltage-divided signal,
wherein the second peak detection circuit is configured to detect a peak voltage of the second band-adjusted signal and output the second peak voltage in accordance with the detected peak voltage of the second band-adjusted signal.

8. The output circuit according to claim 1,
wherein the grounding wire configured to provide a ground potential, and
wherein the series circuit is connected between the second terminal of the inductor and the grounding wire.

9. The output circuit according to claim 8, further comprising:
a semiconductor substrate;
an insulating layer formed on the semiconductor substrate; and
a first metal plate formed above the semiconductor substrate,
wherein the output terminal is provided as an electrode pad formed above the semiconductor substrate, and
wherein the electrode pad, the first metal plate, and the insulating layer configure the first capacitive element.

10. The output circuit according to claim 9,
wherein the first metal plate and the electrode pad face in parallel to each other, and
wherein the insulating layer has a portion interposed between the first metal plate and the electrode pad.

11. The output circuit according to claim 9,
wherein the grounding wire includes a second metal plate, and
wherein the first metal plate, the second metal plate, and the insulating layer configure the second capacitive element.

12. The output circuit according to claim 11,
wherein the first metal plate and the second metal plate face in parallel to each other, and
wherein the insulating layer has a portion interposed between the first metal plate and the second metal plate.

13. The output circuit according to claim 1,
wherein at least one of the first capacitive element and the second capacitive element is formed as an electrostatic discharge (ESD) protection diode.

14. An output circuit comprising:
an inductor;
an amplifier circuit configured to output an output signal via the inductor;
an output terminal configured to output the output signal to an outside;
a voltage divider circuit including a series circuit constituted by a first capacitive element and a second capacitive element connected in series to the first capacitive element, the series circuit being configured to generate a first voltage-divided signal by dividing a voltage of the output signal;
a first band-adjusting element having a resistance component for generating a first band-adjusted signal by adjusting frequency characteristics of the first voltage-divided signal;
a first peak detection circuit configured to detect a peak voltage of the first band-adjusted signal and output a first peak voltage in accordance with the detected peak voltage; and
a second peak detection circuit configured to output a second peak voltage,
wherein the second capacitive element includes a third capacitive element and a fourth capacitive element connected in series to the third capacitive element,
wherein the voltage divider circuit is configured to generate a second voltage-divided signal at a connection point by dividing the voltage of the output signal, the connection point being between the third capacitive element and the fourth capacitive element, and
wherein the second peak detection circuit is configured to output the second peak voltage in accordance with the second voltage-divided signal.

* * * * *